US007705967B2

(12) United States Patent
Opower et al.

(10) Patent No.: US 7,705,967 B2
(45) Date of Patent: Apr. 27, 2010

(54) EXPOSURE SYSTEM

(75) Inventors: Hans Opower, Krailling (DE); Stefan Scharl, Wasserburg (DE)

(73) Assignee: KLEO Maschinenbau AG, Appenzell (CH)

( * ) Notice: Subject to any disclaimer, the term of this patent is extended or adjusted under 35 U.S.C. 154(b) by 820 days.

(21) Appl. No.: 11/406,049

(22) Filed: Apr. 17, 2006

(65) Prior Publication Data

US 2006/0244943 A1 Nov. 2, 2006

(30) Foreign Application Priority Data

Apr. 19, 2005 (DE) ........................ 10 2005 019 144
Feb. 22, 2006 (DE) ........................ 10 2006 008 075

(51) Int. Cl.
G03B 27/54 (2006.01)
(52) U.S. Cl. .............................. 355/70; 355/53; 355/67; 355/72
(58) Field of Classification Search .................. 355/53, 355/67, 70, 72, 75
See application file for complete search history.

(56) References Cited

U.S. PATENT DOCUMENTS 5,302,999 A * 4/1994 Oshida et al. .................. 355/1
5,495,279 A * 2/1996 Sandstrom ................... 347/258
5,862,278 A * 1/1999 Brauch et al. ................. 385/34
6,368,756 B1 4/2002 Yamada et al.
6,788,416 B2 * 9/2004 Reuter ......................... 356/445
2002/0039179 A1 * 4/2002 Tanaka ......................... 355/53
2002/0126479 A1 9/2002 Zhai et al.
2002/0180944 A1 * 12/2002 Fujii et al. .................... 355/70
2003/0053038 A1 * 3/2003 Miyagawa .................... 355/53
2006/0027538 A1 2/2006 Ekberg et al.

FOREIGN PATENT DOCUMENTS

WO 2004/074940 9/2004

* cited by examiner

Primary Examiner—Hung Henry Nguyen
Assistant Examiner—Steven H Whitesell-Gordon
(74) Attorney, Agent, or Firm—Lipsitz & McAllister, LLC

(57) ABSTRACT

In an exposure system for substrate members which bear a photosensitive coating on a substrate surface, comprising a machine frame, a substrate carrier bearing the substrate member and an exposure device, wherein the substrate member and the exposure device can be moved relative to one another such that the photosensitive coating can be exposed as a result of this relative movement, it is suggested for an exposure of the photosensitive coating which is as precise as possible that the exposure device have an optics slide which can be moved in the second direction and on which an optical imaging device for the exposure of the substrate member is arranged, and that the exposure device have a light source unit which is arranged on the machine frame separately from the optics slide and has a plurality of light sources, the radiation of which can be coupled into the optical imaging device.

29 Claims, 31 Drawing Sheets

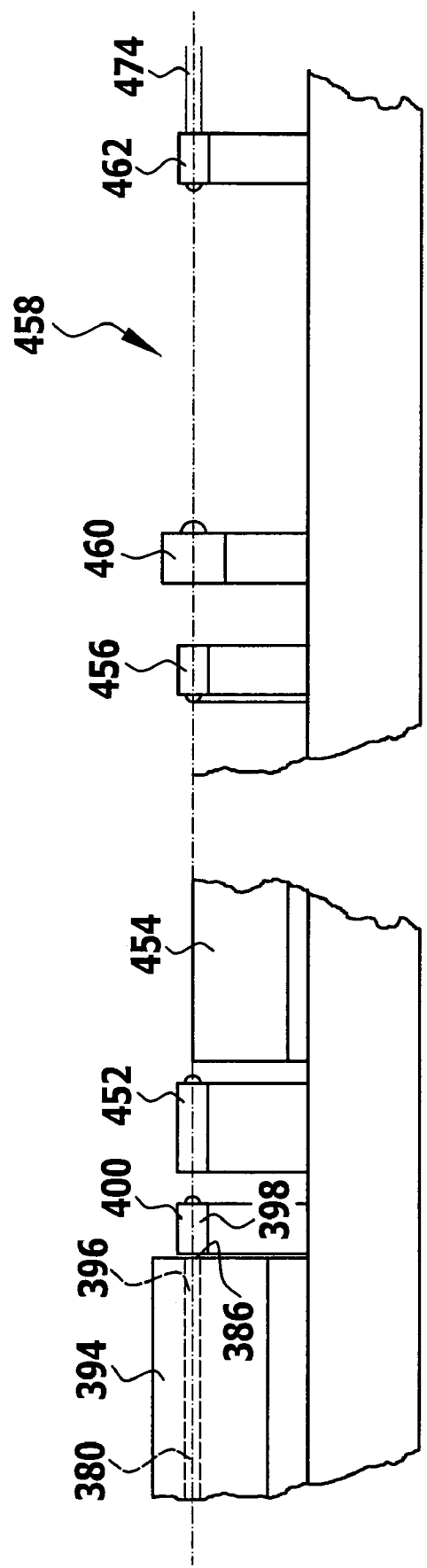

EXPOSURE SYSTEM

The present disclosure relates to the subject matter disclosed in German application number 10 2005 019 144.4 of Apr. 19, 2005 and German application number 10 2006 008 075.0 of Feb. 22, 2006, which are incorporated herein by reference in their entirety and for all purposes.

The invention relates to an exposure system for substrate members which bear a photosensitive coating on a substrate surface, comprising a machine frame, a substrate carrier bearing the substrate member and an exposure device, wherein the substrate member and the exposure device can be moved relative to one another in a first direction parallel to a substrate surface and in a second direction parallel to the substrate surface and extending transversely to the first direction such that the photosensitive coating can be exposed locally and selectively by exposure surfaces, which can be generated by the exposure device, as a result of this relative movement of the exposure device in relation to the photosensitive coating in the first direction and in the second direction.

The problem with exposure systems of this type is that the positioning of the exposure device relative to the photosensitive coating in the first and second directions must be carried out with the highest possible precision in order to be able to generate two-dimensional, exposed structures as precisely as possible as a result of exposure of the photosensitive coating.

This object is accomplished in accordance with the invention, in an exposure system of the type described at the outset, in that the exposure device has an optics slide which is movable in the second direction and on which an optical imaging device for the exposure of the substrate member is arranged, and that the exposure device has a light source unit which is arranged on the machine frame separately from the optics slide and has a plurality of light sources, the radiation of which can be coupled into the optical imaging device.

The advantage of this solution according to the invention is to be seen in the fact that the light sources which generate a lot of heat are decoupled from the optics slide and the optical imaging device and, therefore, any heat input from the light sources into the optics slide and the optical imaging device can essentially be avoided and so the optics slide and the optical imaging device can be positioned precisely relative to the photosensitive coating without the precise positioning being subject to negative influences on account of any heat input from the light sources.

Furthermore, the resources which are required in order to keep the optics slide and the optical imaging device at an essentially constant temperature are far less since the necessity to remove large amounts of heat generated by the light sources does not exist.

Within the scope of the invention, the term "light" is not limited to electromagnetic radiation in the visible range but rather "light" is also to be understood as electromagnetic radiation which is in the ultraviolet range or infrared range. For this reason, the term "exposure" is also to be understood as an irradiation of the electromagnetic radiation falling under the term "light" and a "light source" is also to be understood as a source which generates electromagnetic radiation in the wavelength range falling under the term "light" defined in the above.

It is particularly advantageous with respect to as great a precision as possible during the exposure when the light source unit of the exposure device is arranged separately from a bridge guiding the optics slide.

This separation of the light source unit from the bridge likewise has the advantage that, as a result, no heat input into the element guiding the optics slide takes place as a result of the light source unit and, therefore, problems caused as a result of this with respect to the precision of the guidance of the optics slide are avoided.

Furthermore, it is favorable with respect to the arrangement of the light source unit relative to the bridge when the light source unit is arranged on one side of the bridge in order to obtain paths for the transfer of the light from the light source unit to the optics slide which are as short as possible.

In the case of the solution according to the invention, it is, in principle, possible to arrange the light source unit so as to be stationary or movable on the machine frame so that they are cooled in a simple manner and to move the optics slide with the optical imaging device merely in the second direction. A stationary arrangement of the light sources makes it necessary, on account of the movement of the optics slide, to transfer the radiation of the light sources to the optical imaging device over long distances.

It is particularly favorable, in particular, in order to obtain as short a transfer path for the light as possible when the light source unit can be moved with the optics unit in the second direction so that a so-called entrainment of the light source unit in this direction takes place, in particular, with an optics unit movable in the second direction.

In principle, a rigid coupling could be provided. It is, however, particularly favorable when the light source unit is guided on separate guides provided for it so that as extensive a thermal decoupling as possible of the light source unit from the remaining parts of the exposure system is possible.

In principle, the light source unit could be moved with the optics unit in the second direction, rigidly coupled to it. For reasons of as great a precision as possible for the positioning of the optics unit it is, however, advantageous when the light source unit can be moved in the second direction by means of a linear drive so that this linear drive provided especially for the light source unit can operate independently of the drive for the optics unit in this direction.

As a result, it is also possible, for example, to position the light source unit in the second direction only approximately synchronously in relation to the optics unit without retaining an exact synchronicity.

In this respect, it is particularly favorable when the light source slide is driven such that it essentially follows the movements of the optics slide.

As a result, the transfer paths of the radiation from the light sources to the optical imaging device can be shortened in an optimum manner without foregoing the advantages of the thermal decoupling of the light sources from the optical imaging device.

The coupling of the radiation from the light sources into the optical imaging device may be optimized when the exposure device has a light source slide which can be moved in the second direction and on which the light source unit is arranged.

A light source slide of this type still has the advantages specified above of the decoupling of the optical imaging device from the light sources which generate a considerable amount of heat but, on the other hand, it also has the additional advantage that the paths, via which the radiation from the light sources has to be coupled into the optical imaging device, are kept shorter, namely as a result of the fact that the light source slide can likewise be moved and follow the movements of the optics slide with the optical imaging device at least partially.

With respect to the removal of heat, it is particularly advantageous when the light source unit can be moved on guides arranged outside the machine frame.

In this respect, the light source unit can be arranged in the most varied of ways. One possibility provides for the light source unit to be arranged above the bridge.

Another advantageous solution provides for the light source unit to be arranged to the side next to an end side of the bridge.

With respect to the guidance of the light from the light source unit to the optics unit, a guidance of the light via a mirror assembly would, in principle, be conceivable.

It is, however, particularly favorable when at least one flexible bundle of light guides guides the light from the light source unit to the optics unit.

The bundle of light guides could be arranged so as to be freely suspended. It is, however, particularly favorable when the flexible bundle of light guides is guided in a trailing guide provided on the bridge and leading to the optics slide.

It is provided, for example, for the trailing guide to run in a receiving means provided on the bridge.

In this respect, the receiving means may be designed as a channel provided in the bridge.

In order to obtain an optimum coupling of the radiation of the light sources into the optical imaging device, it is preferably provided for the optical imaging device to be coupled to the light sources of the light source unit via a flexible bundle of light guides.

Flexible light guides of this type represent a very simple possibility of coupling the radiation of the light sources into the optical imaging device and, in particular, they open up the possibility of achieving a precise imaging by the optical imaging device moved with the optics slide since the location of the coupling of the radiation into the optical imaging device can be predetermined relative to the optical imaging device in a defined manner.

In this respect, it is particularly advantageous when one end of the bundle of light guides can be positioned relative to the optical imaging device by means of an adjustable positioning device.

As a result, an optimum adjustment of the entry of the radiation into the optical imaging device can be achieved, on the one hand, but it is, on the other hand, also possible to still displace the exposure spots, which can be generated by the optical imaging device on the photosensitive coating, relative to the optical imaging device due to variation of the position of the light guides relative to the optical imaging device.

In this respect, the positioning device is preferably designed such that it allows at least one exposure spot generated by the optical imaging device to be displaced on the photosensitive coating in at least one direction parallel to a coating surface, preferably in two directions parallel to the coating surface and extending transversely to one another.

In this respect, it is particularly advantageous when the two directions, which extend transversely to one another and along which the exposure spot can be displaced on the photosensitive coating, coincide with the first direction and the second direction, along which the substrate slide and the optics slide can be moved.

A further, advantageous embodiment of the positioning device provides for the end of the bundle of light guides to be movable relative to the optical imaging device with the positioning device in such a manner that a diameter of the at least one exposure spot which can be generated on the photosensitive coating is variable.

In order to obtain an optimum focusing of the light onto the photosensitive coating, it is preferably provided for the optical imaging device to be provided with an automatic focus.

With respect to the positioning device, no further details have so far been given. The positioning devices may, for example, be mechanical linear or tilting drives.

One particularly favorable solution provides, however, for the positioning device to comprise a piezo drive as actuating drive. Such a piezo drive opens up the possibility of positioning relative precisely and exactly with short paths of adjustment.

Such a piezo drive also offers the possibility, in particular, of combining it with a very precise measurement system.

With respect to the design of the optics slide, no further details have so far been given. The optical imaging device can, for example, be mounted rigidly on the optics slide.

One advantageous solution provides for the optics slide to bear an optics unit which comprises the optical imaging device and can be moved relative to the optics slide.

In this respect, it is advantageous, in particular, when the optics unit can be moved relative to the optics slide in a third direction extending transversely to the first and second directions in order to always obtain an optimum focus position of the exposure spot during the exposure of the substrate member due to movement of the optics unit relative to the optics slide.

Such a movability of the optics unit allows, in particular, an adjustment of the position of the optics unit to different thicknesses of the substrate members which can be arranged on the substrate slide.

As a result, a pre-adjustment of the optics unit relative to the photosensitive coating on the substrate member is possible in an optimum manner.

In order, in addition, to obtain an optimum position of the focus position even with a, where applicable, varying substrate thickness, the optical imaging device is provided with an automatic focusing system which maintains a preset focusing of the exposure spot on the photosensitive coating.

In order to be able to monitor during the exposure of the markings on the substrate member, it is provided, in particular, for the optics unit to comprise an optical monitoring device coupled to the optical imaging device so that it is possible with the optical monitoring device to follow and check the exposure of the photosensitive coating via the optical imaging device.

So that sufficient light is available for the optical monitoring device, it is provided, in addition, for the optical monitoring device to be provided with an optical illumination device which likewise illuminates the area of the photosensitive coating to be exposed via the optical imaging device so that monitoring of the exposure of the coating via the optical monitoring device is possible but, however, also such that the illumination of this area cannot lead or contribute to the chemical alteration of the photosensitive coating.

With respect to the guidance of the optics slide on the machine frame, no further details have so far been given.

One advantageous solution, for example, provides for the optics slide to be guided on the machine frame on a guide extending above a movement area of substrate slide and substrate member.

This guide is preferably designed as a bridge extending over the movement area.

In order to obtain as precise an exposure as possible of the photosensitive coating, a longitudinal measurement system is preferably provided which constantly detects the position of the optics slide in the second direction during the movement of the optics slide.

As a result, the position of the optics slide in the second direction can constantly be monitored and the exposure of the photosensitive coating can take place in accordance with the actual measured position of the optics slide.

Since no absolutely straight-line movement of the optics slide in the second direction is brought about even with a precise guidance of the optics slide in this direction, a transverse measurement system is preferably provided which constantly detects the positions of the optics slide transverse to the second direction during the movement of the optics slide.

As a result, it is also possible with the transverse measurement system to recognize guidance inaccuracies in the guidance of the optics slide and, where applicable, to compensate for them by means of corresponding control of the relative movement of optics slide and substrate slide.

In this respect, it is particularly favorable when the transverse measurement system detects the positions of the optics slide in the first direction so that the possibility of a compensation of deviations of the movement of the optics slide in the first direction is possible in a simple manner due to corresponding movement of the substrate slide in the first direction.

The longitudinal measurement system and/or the transverse measurement system, as well, are, preferably, optical measuring devices which detect a light path, in particular, interferometrically.

For example, a light path between a transmitting and receiving head, on the one hand, as well as a reflector, on the other hand, is detected interferometrically with such interferometric measuring devices.

In the case of the longitudinal measurement system, the transmitting and receiving head is expediently arranged stationarily whereas the reflector is seated on the optics slide.

In contrast thereto, it is preferably provided in the case of the transverse measurement system for the transmitting and receiving head to be seated on the optics slide and the reflector to be arranged stationarily, wherein the reflector has in the second direction, along which the optics slide is moved, an extension which corresponds at least to the distance covered by the optics slide.

Alternatively and in addition to the solution described thus far, the object specified at the outset is accomplished in accordance with the invention, in an exposure system of the type specified at the outset, in that the machine frame has a base, on which the substrate slide is guided so as to be movable in the first direction.

Such a base is preferably designed such that it has a mass which is many times greater, at least by a factor of 100, in comparison with the substrate slide.

Such a base is expediently formed from granite.

In order to decouple vibrations from the surroundings, it is preferably provided for the base to be arranged on vibration-damping supports.

In order to be able to move the exposure device in a suitable manner in the second direction, it is preferably provided for the machine frame to have a bridge which extends transversely to the first direction and on which an optics slide of the exposure device is guided.

The bridge could be arranged on the machine frame independently of the base.

It is, however, particularly favorable when the bridge is arranged on the base.

The bridge is likewise expediently formed from granite.

In order to keep the length of the base in the first direction as small as possible, it is preferably provided for the substrate table to be movable relative to the bridge in such a manner than the substrate table can travel out completely from under the bridge only on one side of the bridge.

This one-sided, complete traveling out of the substrate table from under the bridge is required in order to be able to remove the substrate member from the substrate table and to place an additional substrate member on the substrate table.

With respect to the drive of the substrate slide, no further details have so far been given. It would, for example, be conceivable to drive the substrate slide by means of pneumatic or similar drives.

One advantageous solution provides for the substrate slide to be movable in the first direction by means of at least one electric linear drive.

In order to achieve great accelerations of the substrate table with movement thereof which is as free from torsion as possible, it is preferably provided for the substrate table to be movable in the first direction by means of two linear drives which are arranged at a distance from one another since, as a result, an active parallel guidance of the substrate slide can be brought about by way of the appropriate activation of the two linear drives.

In addition or alternatively to the embodiments described thus far, an additional solution to the object specified at the outset for an exposure system of the type described at the outset provides for the substrate slide to be constructed as a supporting framework structure.

In contrast to a construction of the substrate slide from a solid material, such a supporting framework structure has the advantage of a high rigidity with a low mass which is to be accelerated.

In this respect, it is expediently provided for the supporting framework structure of the substrate slide to have at least one surface structure and transversely to the surface structure a reinforcing structure consisting of reinforcing walls extending transversely to the surface structure.

With this solution, an optimum rigidity of the substrate slide with as low a mass as possible can be achieved.

In this respect, the surface structure is preferably designed as an upper and/or lower wall of the substrate slide while the reinforcing walls extend at right angles to this wall.

In this respect, several reinforcing walls are, in particular, provided and these are connected to one another and form an interconnected grating structure which is connected to the surface structure.

With respect to the material for the substrate slide, no further details have so far been given. It is particularly favorable, for example, when the substrate slide is produced from a lightweight material.

A fiber reinforced material, in particular, a carbon fiber reinforced material has proven to be particularly suitable as lightweight material for the substrate slide.

The substrate slide is expediently produced from a C/SiC material.

In order to configure the drive of the substrate slide in as optimum a manner as possible, it is provided for a rotor of the at least one linear drive to be arranged directly on the substrate slide.

In order to avoid any input of heat into the substrate slide and, therefore, inaccuracies on account of the substrate slide heating up, it is preferably provided for the at least one rotor to be cooled in the area of a foot provided for the mounting thereof.

In this respect, the cooling of the rotor is preferably a liquid cooling.

In the simplest case, it is provided for the foot of the at least one rotor to be penetrated by cooling channels.

Since the substrate slide, despite a low mass, could generate vibrations in the base due to the transfer of momentum to the base on account of the oscillating movement back and forth, at least one momentum compensating slide is preferably provided which can essentially be moved in the opposite direction to the substrate slide in order to compensate for the momentum transferred to the base by the substrate slide during the acceleration and braking.

In this respect, it is particularly advantageous when the substrate slide is arranged between two momentum compensating slides which can be moved in the opposite direction to it.

In this respect, it is preferably provided for the at least one momentum compensating slide to be driven by an electric linear drive.

In the case of an electric linear drive, it is particularly expedient when the at least one momentum compensating slide is coupled electronically to the substrate slide in the opposite direction so that a mechanical coupling may be dispensed with.

Such an electronic coupling allows, in addition, for a compensation of momentums of the substrate slide which are of different magnitudes and can result due to the fact that the substrate member can have a differing mass.

It is particularly advantageous for the compensation of momentum when a center of mass of the substrate slide and a center of mass of the at least one momentum compensating slide are arranged in a common plane so that forces occurring during the compensation of momentum and extending transversely to the plane can be avoided.

In order to be able to detect the position of the substrate slide exactly, as well, a longitudinal measurement system is preferably provided which constantly detects the position of the substrate slide in the first direction during the movement of the substrate slide.

Since movements transversely to the first direction can occur despite an exact guidance of the substrate slide, a transverse measurement system is preferably provided which constantly detects the position of the substrate slide transversely to the first direction during the movement of the substrate slide.

In this respect, the transverse measurement system detects, in particular, the movement of the substrate slide in the second direction.

The longitudinal measurement system and/or the transverse measurement system are preferably designed as optical measuring systems which undertake an interferometric distance measurement.

The precision during the exposure of the photosensitive coating is, however, dependent, in the case of an exposure system of the type described at the outset, not only on the precision of the positioning but also on the thermal stability of the exposure system.

For this reason, the object specified at the outset is accomplished in a further embodiment of an exposure system of the type described at the outset in that at least one heat exchanger element is arranged above a movement area of the substrate slide and the substrate member, this element withdrawing heat from a gaseous cooling medium present in the movement area.

It is possible as a result of such a heat exchanger element to keep the cooling medium at a constant temperature over a large surface area, namely due to the fact that heat is withdrawn from the cooling medium which is introduced into the cooling medium as a result of the exposure of the photosensitive coating of the substrate member and, therefore, via the substrate member.

In this respect, heat exchanger elements are preferably provided above the movement area on both sides adjoining the bridge.

A particularly advantageous effect of the at least one heat exchanger element is achieved when the heat exchanger element has heat exchanger surfaces extending in the direction of the movement area.

These heat exchanger surfaces increase the surface area available for the exchange of heat with the cooling medium and, therefore, make the exchange of heat more effective.

It is particularly favorable when the heat exchanger surfaces extend parallel to a predetermined direction.

The predetermined direction is preferably the first direction, in which the substrate slide moves in an oscillating manner during the exposure of the photosensitive coating.

In this respect, it is favorable, in particular, when the heat exchanger surfaces are arranged such that a flow channel results which extends in the predetermined direction.

The heat exchanger element may, however, be provided not only for the temperature adjustment of the cooling medium present in the movement area but also for the purpose of adjusting the temperature of an additional substrate member.

In this respect, the heat exchanger element can be in contact with the additional substrate member, the temperature of which is to be adjusted, via an additional, for example, gaseous cooling medium.

It is, however, particularly advantageous when the heat exchanger element interacts with the substrate member, the temperature of which is to be adjusted, by way of bodily contact.

In the simplest case, the heat exchanger element is designed as a carrier for the substrate member, the temperature of which is to be adjusted, and so the substrate member rests on the heat exchanger element.

Expediently, the substrate member sits areally on the heat exchanger element.

Furthermore, the temperature adjustment of the substrate slide with the substrate member to be exposed may be improved further in that the movement area of the substrate slide and of the substrate member has a flow of a temperature-stabilized, gaseous cooling medium passing through it.

Such a flow of gaseous cooling medium serves the purpose of keeping the substrate member with the photosensitive coating at an essentially constant temperature despite the energy introduced during the exposure thereof in order to thus avoid deformations which could occur due to heat expansion.

In this respect, it is particularly favorable when the flow of the gaseous cooling medium flows over a coating surface of the photosensitive coating.

In order to obtain a directed flow of the gaseous cooling medium, it is provided for the flow of the gaseous cooling medium to run from a supply channel to a discharge channel.

The flow of the cooling medium could run transversely to the first direction.

In this respect, it is favorable, in particular, when the flow of the gaseous cooling medium runs along the movement area approximately parallel to the first direction.

In this case, a respective supply channel is preferably arranged in an end area of the machine frame located opposite the bridge so that the flow of the gaseous cooling medium flows each time from the end area of the machine frame located opposite the bridge in the direction of the bridge.

Alternatively thereto, it is provided for at least one supply channel to be arranged in the area of the bridge.

Furthermore, it is expediently provided for the discharge channel to be arranged in the area above the bridge so that the flow of the gaseous cooling medium can also flow around and cool the bridge and, in particular, the exposure device.

In this respect, the flow of the gaseous cooling medium is guided, in particular, through an optics movement area arranged above the bridge.

In order to also obtain optimum conditions with respect to the temperature adjustment of the optical imaging device, it is preferably provided for the flow of the gaseous cooling medium in the optics movement area to flow first of all around the optics slide with the optical imaging device and then around the light source unit so that the considerable heating up of the cooling medium in the area of the light source unit cannot have any negative effect on the temperature of the optical imaging device or of the substrate member.

The flow of the gaseous cooling medium preferably passes through a reprocessing device after the discharge thereof through the discharge channel and is supplied from there to the supply channel.

It is preferably provided, in particular, when a heat exchanger element is used for a flow of the gaseous cooling medium to flow along on a side of the heat exchanger element which faces the substrate member on the substrate slide.

In this respect, the flow flows expediently through flow channels which are arranged on this side of the heat exchanger element and are formed by the heat exchanger ribs.

In order, in addition, to be able to adjust the temperature of the substrate member, the temperature of which is to be adjusted, in an optimum manner, it is provided for the substrate member, which is arranged on the heat exchanger element and the temperature of which is to be adjusted, to have a flow of the gaseous cooling medium flowing over it on a side facing away from the substrate slide.

In the case of the guidance of the flow of gaseous medium described thus far, no further details have been given as to how this flow is intended to be directed.

In principle, the flow of the gaseous cooling medium can run transversely to the first direction.

It is favorable, in adaptation to the movement of the substrate slide, when the flow of the cooling medium runs approximately parallel to the first direction.

One possibility provides, in addition, for the flow of the gaseous medium to be guided to the bridge from the ends of the base member.

Another possibility provides for the flow of the gaseous cooling medium to be guided from the bridge to the ends of the base member.

In addition, it is provided in the case of the possibilities described above, in both cases, for some of the gaseous cooling medium to also pass through the optics space in order to adjust the temperature of or rather cool the optics unit, in particular, the optical imaging device and the light source unit one after the other.

In the case of the guidance of the flow consisting of gaseous cooling medium, it must always be expected that this flow also entrains very small particles which can lead to errors during the production of the exposed structure.

For this reason, a guide provided for the guidance of the flow of the gaseous cooling medium is advantageously of the type which moves the least amount of dirt in the area of the exposure.

One solution provides in this respect for the gaseous cooling medium to flow under the optical imaging device on its side facing the coating in order, as a result, to always keep the optical imaging device free from dirt particles in the area facing the exposed structure.

One favorable solution provides in this respect for a supply channel for the gaseous cooling medium to be provided along the positions of the optical imaging device in order to be able to supply the flow of the gaseous cooling medium, which is intended to flow under the optical imaging device on its side facing the coating, immediately adjacent to the side of the optical imaging device facing the coating.

In order to be able to introduce the substrate member into the exposure system in an optimum manner in the case of the exposure system according to the invention, a substrate feeder table is preferably provided, via which substrate members can be supplied to the exposure system.

If only one substrate member is to be supplied to the substrate slide, the substrate feeder table is arranged at the level of the substrate slide so that the substrate member can be moved onto the substrate slide or vice versa in a plane of the substrate feeder table.

In this respect, the substrate feeder table is preferably arranged so as to be vertically adjustable so that the substrate feeder table can be arranged, on the one hand, such that the substrate member can be moved from it either onto the substrate slide or onto the heat exchanger element or can be removed from either of the two.

In this respect, the substrate feeder table is, in particular, adjustable in such a manner that the substrate member can be displaced without being offset vertically in a respective plane between the substrate feeder table and the substrate slide or the substrate feeder table and the heat exchanger element.

In order to facilitate the displaceability of the substrate member, not only the substrate feeder table but also the substrate slide or the substrate feeder table and the heat exchanger element are provided with devices for generating a cushion of air so that the respective substrate member can be moved on a cushion of air from the substrate feeder table onto the substrate slide or vice versa or from the substrate feeder table onto the heat exchanger element or vice versa.

In the simplest case, the substrate feeder table is vertically adjustable in such a manner that it can be adjusted between a level of the substrate slide and a level of the heat exchanger element.

In order to be able to fix the substrate member in position on the substrate slide, suction elements are preferably provided on the substrate slide, with which the substrate member can be fixed in position in a simple manner on the substrate slide by way of suction.

Additional features and advantages of the invention are the subject matter of the following description as well as the drawings illustrating several embodiments. In the drawings:

FIG. 31 shows an illustration similar to FIG. 30 with an enlarged illustration of the areas I and K in FIG. 30.

Figure 1:
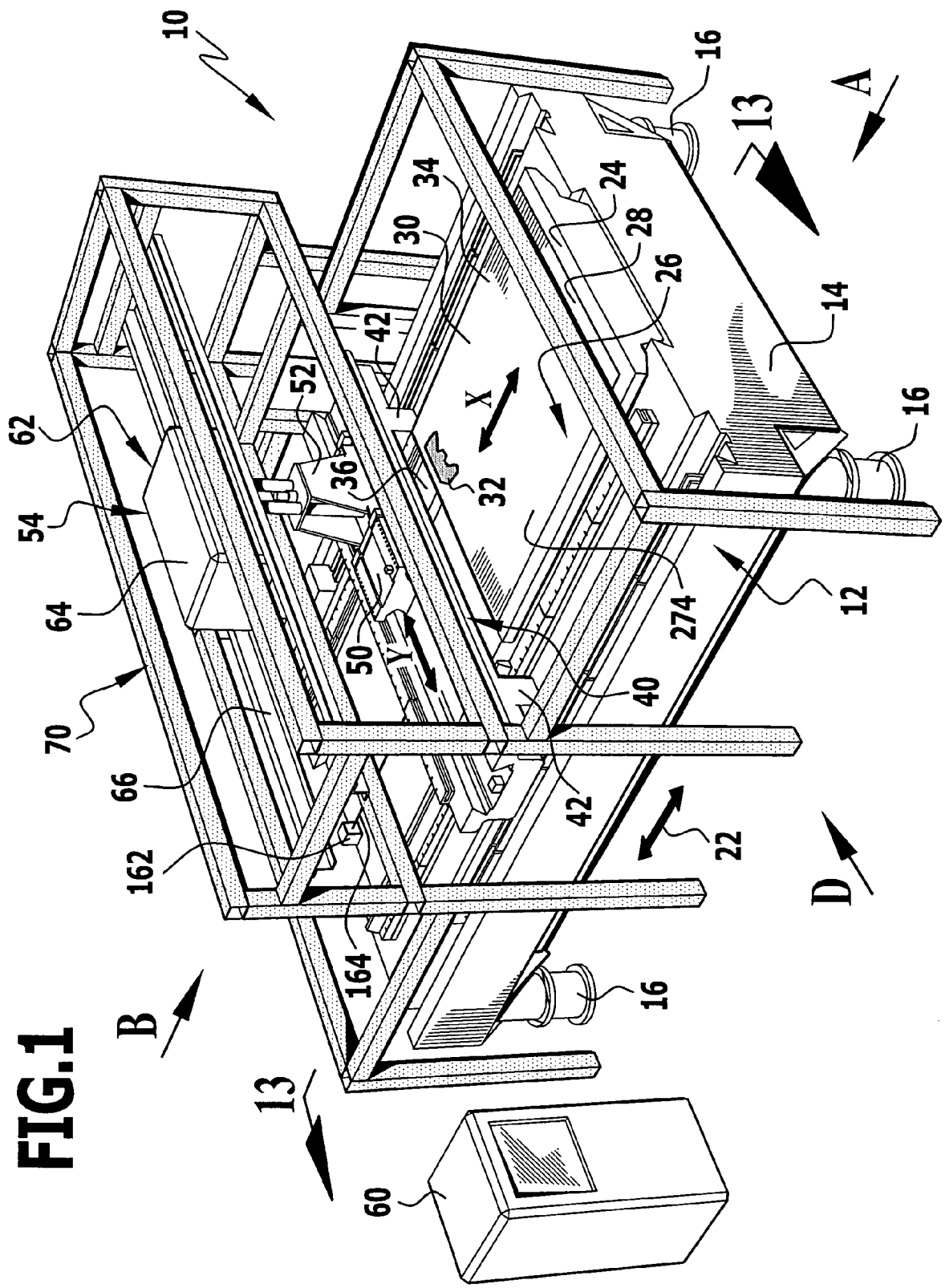
FIG. 1 shows a perspective view of an exposure system according to the invention without any outer cover of a first embodiment.

One embodiment of an exposure system according to the invention, designated as a whole as 10, comprises a machine frame 12 with a base member 14 which is arranged, for its part, on vibration-damping supports 16 (FIG. 1).

The base member 14 is preferably produced from granite and therefore offers several advantages.

One advantage is to be seen in the fact that on account of its high specific weight the base member 14 represents a large mass which is effective in a damping manner in relation to external and internal vibrations and, as a result, it can be advantageously decoupled in relation to external vibrations, in particular, on account of the supports 16 which are provided with damping elements.

Furthermore, such a base member 14 consisting of granite has the advantage that granite is a material which is distortion-free and can be machined with great accuracy and which represents an advantageous base for the individual components of the extremely precise exposure system.

A substrate slide designated as a whole as 20 is guided on the base member 14 for linear movement in a first direction X, wherein the first direction X extends approximately parallel to a longitudinal direction 22 of the base member 14 and parallel to a supporting surface 24 of the substrate slide 20.

Furthermore, a substrate member designated as a whole as 26 can be positioned on the supporting surface 24 of the substrate slide 20 and this substrate member is provided on its substrate surface 28 facing away from the supporting surface 24 with a photosensitive coating 30.

The photosensitive coating 30 may be provided by way of locally targeted exposure with exposed structures 32 which, for example, behave differently in relation to an etching solution during a subsequent etching process than unexposed areas 34 of the coating 30.

In order to generate the exposed structures 32, the substrate slide 20 can be moved with the substrate member 26 arranged on its supporting surface 24 in a movement area 36 located above the base member 14 and extending in the first direction X.

Furthermore, a bridge designated as a whole as 40 is seated on the base member 14 and this bridge extends over the movement area 36 in a second direction Y extending transversely to the first direction X and is supported on the base member 14 to the side of the movement area 36 with bridge supports 42.

The bridge 40 is likewise preferably produced from granite and therefore has the same advantages as the base member 14.

In this respect, an optics slide designated as a whole as 50 is guided on the bridge 40 and this slide can be moved along the bridge 40 in the second direction Y and supports at least one optical imaging device 52 of an exposure device which is designated as a whole as 54 and can be moved in the second direction Y relative to the substrate slide 20 in an optics movement area 38 in order to be able to generate two-dimensional exposed structures 32 in the coating 30 of the substrate member 26 due to targeted local exposure in conjunction with a movement of the substrate slide 20 and of the optics slide 50.

The generation of the exposed structures is brought about, for example, in the manner described in WO 98/00760. An improved type of exposure of the coating 30 is described in EP 1 319 984 A2 and an additional, improved solution in WO 2004/029721 A2. With respect to the generation of the exposed structures 32, the design of the optical imaging device and of the operation in detail, reference is therefore made in full to these publications.

Not only the movement of the substrate slide 20 but also the movement of the optics slide 50 in conjunction with the targeted, local exposure of the coating 30 can be controlled by a control designated as a whole as 60, wherein the control 60 automatically carries out the exposure of the photosensitive coating 30 in conjunction with the movement of the substrate slide 20 and the optics slide 50 in accordance with the specification of shape and size of the exposed structure 32.

In the embodiment illustrated, the exposure device 54 is divided into the optical imaging device 52 which is seated on the optics slide 50 and a light source unit 62 which comprises light sources 61, in particular, laser light sources and is seated on a light source slide 64 which, for its part, is held on slide guides 66 of a frame 70 of the machine frame 12 which engages over the base member 14 and the bridge 40.

Figure 2:
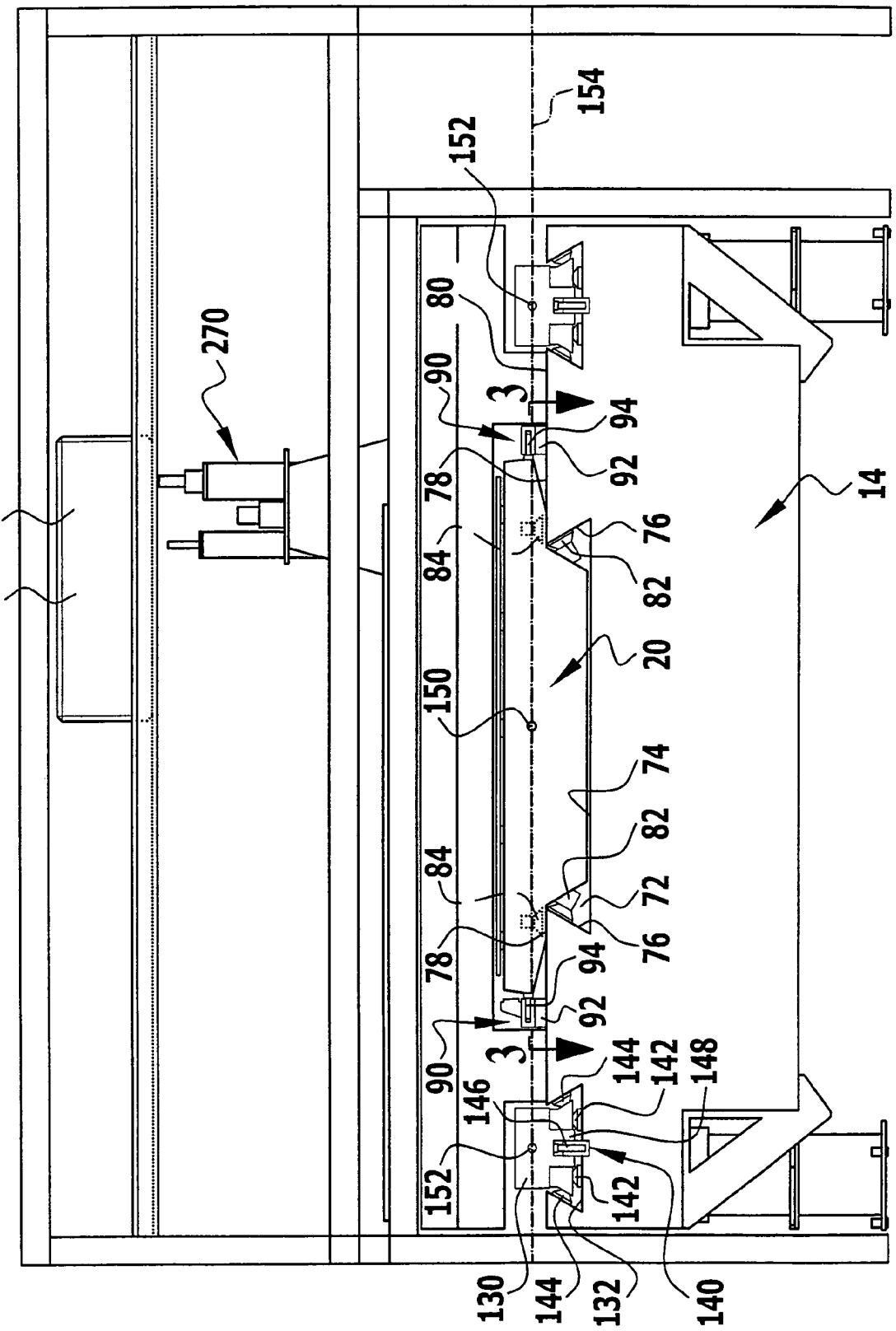
FIG. 2 shows a view in the direction of arrow A in FIG. 1 of the first embodiment.
Figure 3:
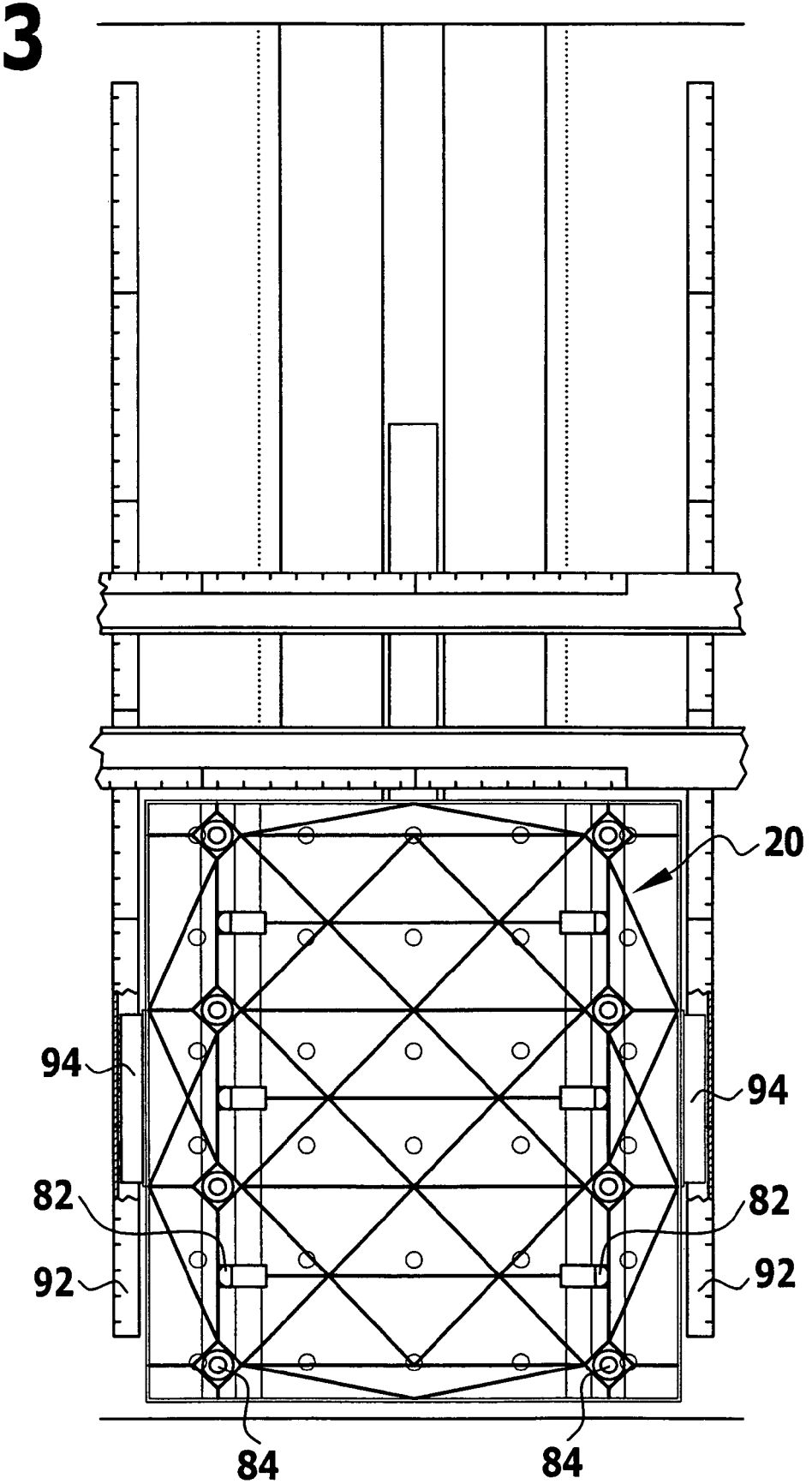
FIG. 3 shows a section along line 3-3 in FIG. 2 of the first embodiment.

As illustrated in detail in FIGS. 2 and 3, the base member 14 comprises a dovetailed recess 72 with a base surface 74 and side surfaces 76 which extend from the base surface 74 and away from it and thereby form an acute angle with the base surface 74. The side surfaces 76 extend as far as supporting surfaces 78 which again extend approximately parallel to the base surface 74, are arranged, for example, on an upper side 80 of the base member 14 and form an angle with the side surfaces 76 which is greater than 270°.

In this respect, the supporting surfaces 78 and the side surfaces 76 preferably form guide surfaces for the guidance of the substrate table 20 in the first direction X, wherein the substrate table 20 does not rest on the side surfaces 76 and the supporting surfaces 78 over its entire area but rather has sliding members 82 which are slidingly guided on the side surfaces 76 as well as sliding members 84 which are slidingly guided on the supporting surfaces 78, wherein the sliding members 82, 84 are preferably designed such that they generate a cushion of air on the side surfaces 76 and supporting surfaces 78, respectively, and, therefore, slide on this cushion of air.

The side surfaces 76 extending parallel to the first direction X as well as the supporting surfaces 78 are preferably ground directly onto the base member 14 consisting of granite, as illustrated in FIG. 2, or the guide member 14 consisting of granite bears, for its part, small rails which are provided with the side surfaces 76 and the supporting surface 78, respectively, but are, for their part, supported on the base member 14 and so this is decisive for the rigidity of such rails.

In order to move the substrate slide 20, electric linear drives 90 are provided which extend in the first direction X and comprise stator elements 92 arranged on respective sides of the supporting surfaces 78 facing away from one another.

In this respect, the stator elements 92 are likewise preferably arranged directly on the base member 14, for example, are supported on ground surface areas thereof.

Furthermore, the substrate slide 20 bears rotors 94 which are arranged to the side thereof, can be driven by the stator elements 92 of the linear drives 90 in the first direction X and, therefore, can be moved in this direction together with the substrate slide 20.

Figure 4:
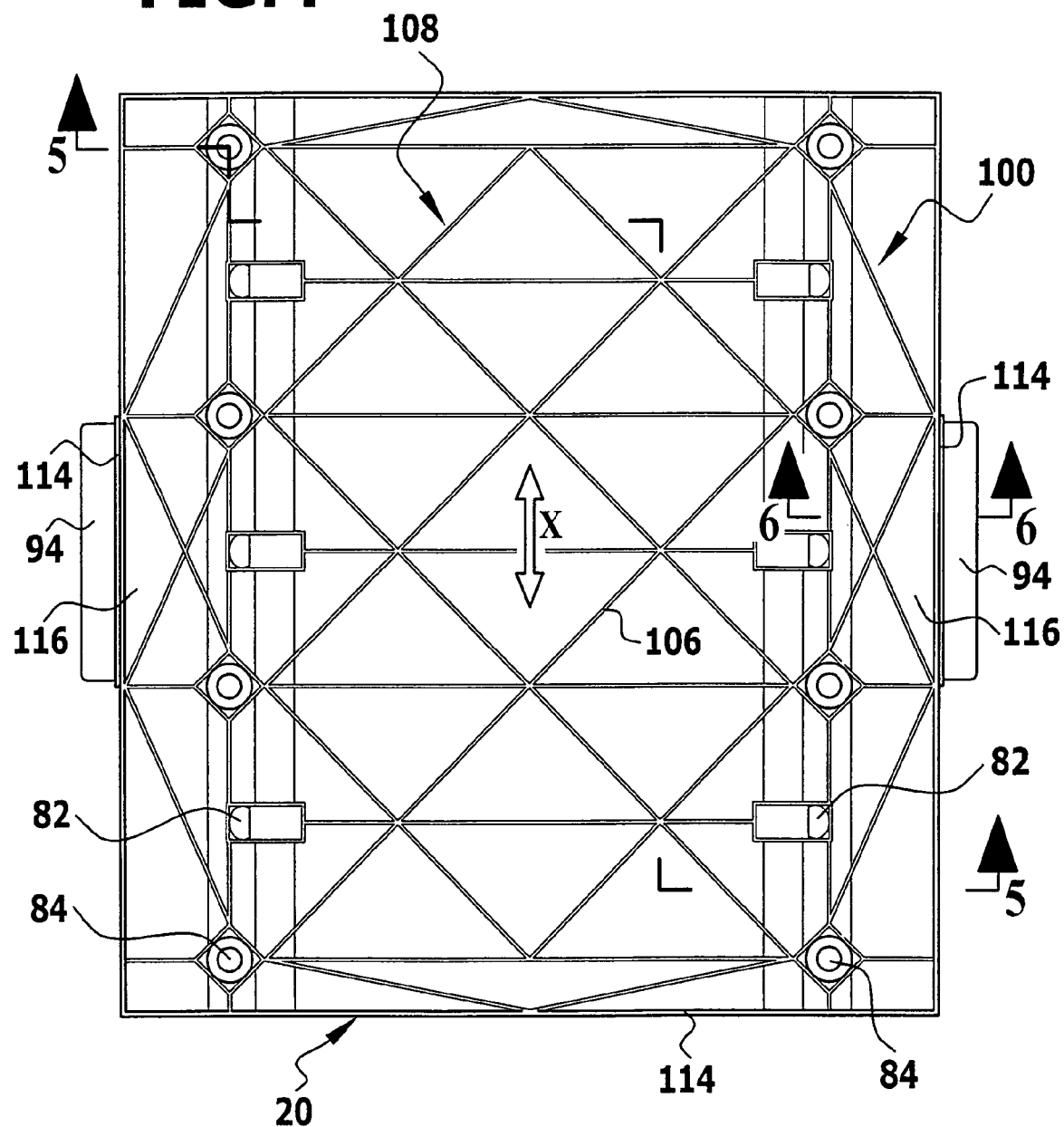
FIG. 4 shows an enlarged illustration of the section according to FIG. 3 through a substrate slide of the first embodiment.
Figure 5:
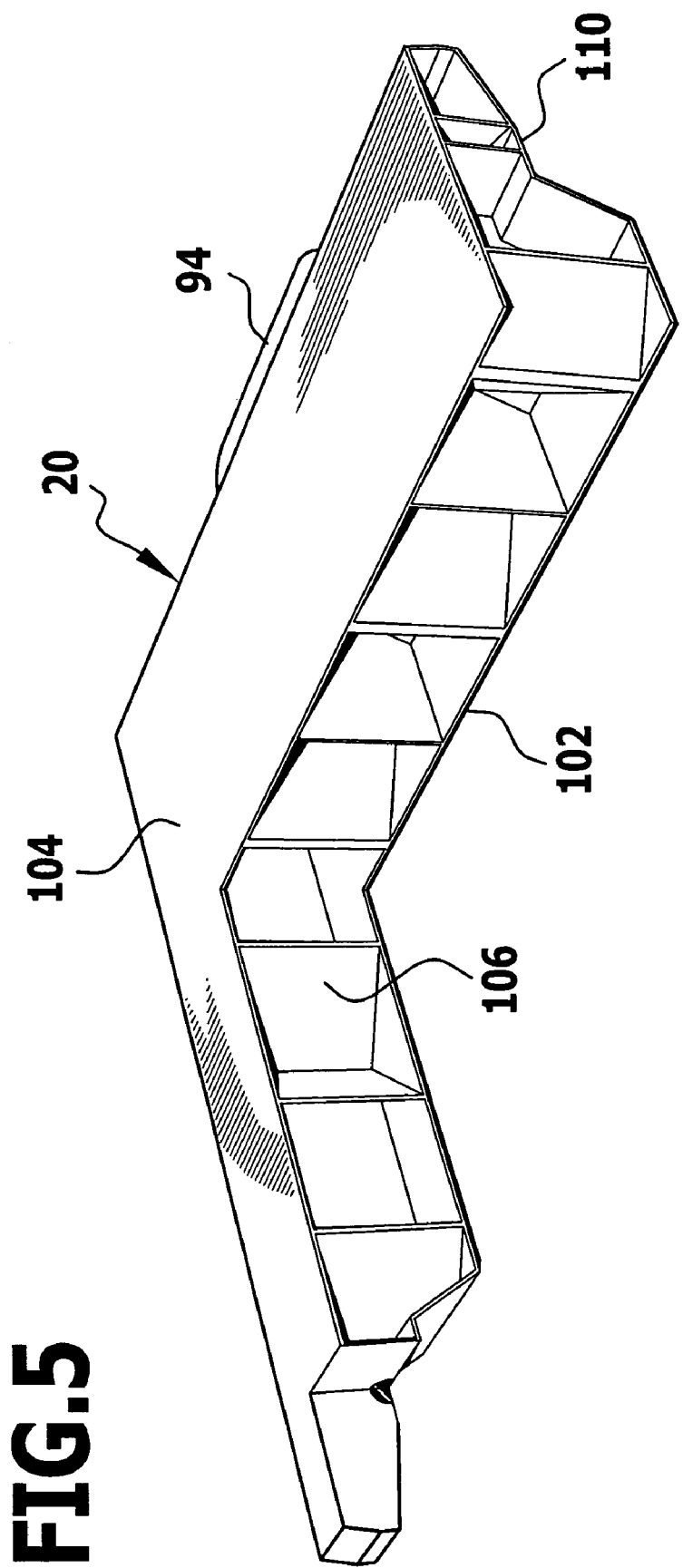
FIG. 5 shows a section along line 5-5 in FIG. 4 of the first embodiment.
Figure 6:
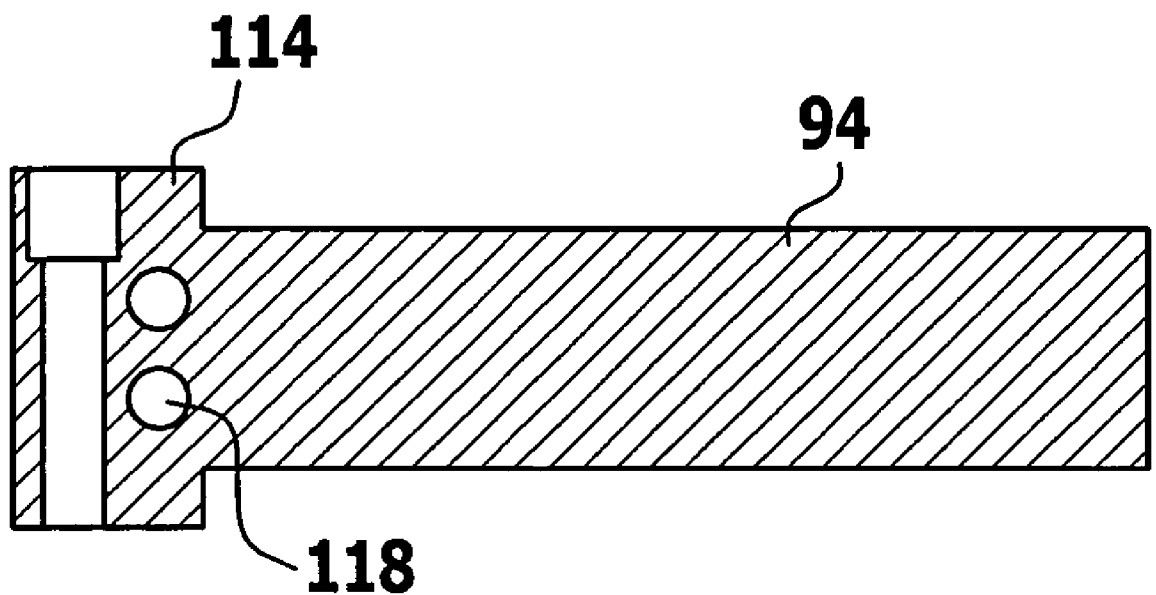
FIG. 6 shows a section along line 6-6 in FIG. 4 of the first embodiment.

As illustrated in FIGS. 3 to 5, the substrate slide 20 is constructed in the form of a supporting framework structure 100 which has a wall 102 as lower surface structure and a wall 104 as upper surface structure forming the supporting surface 24, these walls being connected to one another by reinforcing walls 106 which are of a strip-like design and extend approximately at right angles to these walls, wherein the reinforcing walls 106, as illustrated in FIG. 4, extend transversely to the first direction X, at least to an appreciable extent, and form either approximately a right angle and/or an acute angle with the first direction X so that they form a reinforcing structure 108 between the lower wall 102 and the upper wall 104 which is divided into cavities like a honeycomb.

Furthermore, the supporting framework structure 100 is closed to the side by side walls 110 and at the ends by closure walls 112.

Moreover, the anchoring for the sliding members 82 and 84 is integrated in the supporting frame structure 100 and so they are likewise anchored in it with the rigidity inherent in the supporting framework structure 100.

In addition, the anchoring of the rotors 94, which are mounted with foot members 114 on areas 116 of the side walls 110 reinforced accordingly by the reinforcing structure 108, is also integrated into the supporting framework structure 100.

The entire supporting framework structure 100 of the substrate slide 20 is preferably configured as a high-strength lightweight construction, wherein the lower wall 102, the upper wall 104, the reinforcing walls 106 of the reinforcing structure 108 as well as the side walls 110 and the closure walls 112 are produced from a carbon fiber reinforced silicon carbide C/SiC, whereby the substrate slide 20 is given, on the one hand, as great a rigidity as possible with as little mass as possible. As a result, the mechanical resonance frequencies of the substrate table 20 are so high that they are essentially not excited during any oscillating movement of the substrate slide 20 back and forth.

In order, in addition, to avoid any mechanical inaccuracies due to heating up of the substrate slide 20, the rotors 94 seated on it are provided, in particular, in the area of their foot members 114 with cooling channels 118, through which a cooling medium flows which removes the heat resulting in the rotors 94 to as great an extent as possible and so any heating up of the substrate table 20 is prevented.

In order to be able to supply the substrate table 20 not only with cooling medium for the cooling channels 118 but also with compressed air for the sliding members 82, 84, the substrate table 20 is connected to a supply chain 120 which runs in a receiving means 122 in the base member 14 and extends in a C shape to the substrate slide 20 from an end connected securely to the base member 14.

Although the substrate slide 20 is produced in a lightweight mode of construction, an oscillating movement of the substrate slide 20, driven by the linear drives 90, leads to a transfer of momentum to the base member 14 and, therefore, to vibrations thereof.

Figure 7:
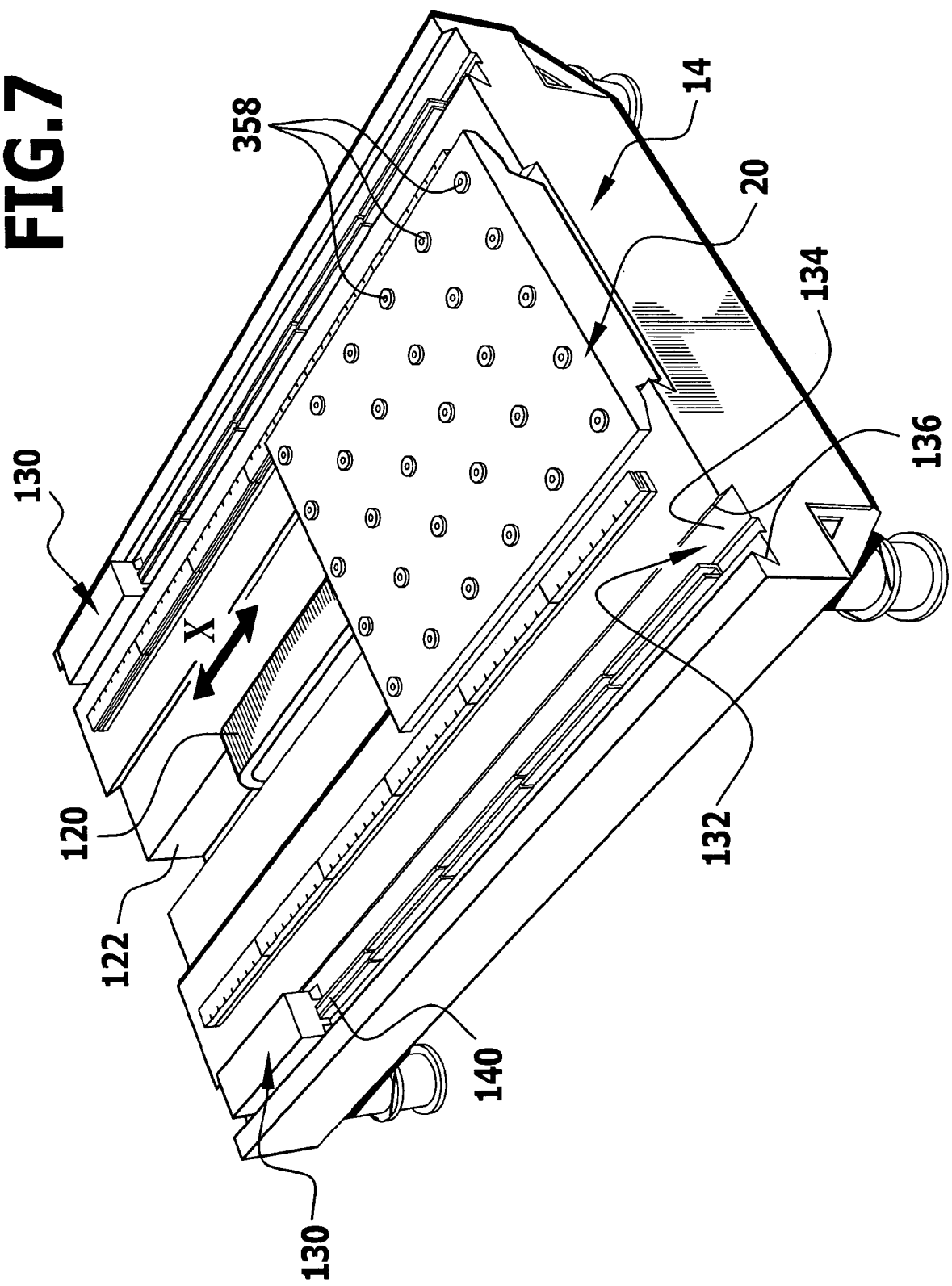
FIG. 7 shows a perspective illustration of a base with a substrate slide similar to FIG. 1 but without a bridge and exposure device as well as without a frame of the first embodiment.

For this reason, as illustrated in FIGS. 1, 2 and 7, momentum compensating slides 130 are provided on both sides of the substrate slide and these are guided in a dovetailed recess 132 which comprises a base surface 134 and two lateral guide surfaces 136 which are inclined at an acute angle in relation to the base surface 134 and on which the momentum compensating slides 130 are guided so as to be movable linearly in the first direction X.

For this purpose, each momentum compensating slide 130 comprises two sliding members 142 which are arranged at a distance from one another, rest slidingly on the base surface 134 and between which an electric linear drive 140 is arranged.

Furthermore, sliding members 144 likewise slide on the two lateral guide surfaces 136 and so the momentum compensating slide 130 is guided parallel to the first direction X in the recess 132.

The two momentum compensating slides 130 have a mass which corresponds in total to approximately the mass of the substrate slide 20 with the substrate member 26 arranged on it.

Each linear drive 140 is designed such that a stator 146 is connected securely to the base member 14 and projects beyond the base surface 134 of the recess 132, wherein the stator 146 is enclosed by a rotor 148 which is securely connected to the momentum compensating slide 130.

The linear drive 140 of each one of the momentum compensating slides 130 is coupled electronically in the opposite direction to the linear drives 90 of the substrate slide 20 so that the two momentum compensating slides 130 perform a movement in relation to the substrate slide 20 which is exactly in the opposite direction and, therefore, compensate for the momentum acting on the base member 14 during the accelerating and braking of the substrate slide 20.

The control 60 can provide for a rigid coupling. It is, however, also conceivable to design the control 60 such that the relative phase of the movements of the momentum compensation slide 130 in relation to the substrate member 20 as well as the amplitude thereof and the maximum speed thereof is adjustable in order to achieve an optimum compensation of momentum.

The compensation of the movements of the substrate slide 20 is particularly advantageous when a center of mass 150 of the substrate slide and centers of mass 152 of the momentum compensation slides are located in the same plane 154 which extends parallel to the first direction X so that, as a result, an optimum compensation of momentum is possible and essentially no torques occur.

Figure 8:
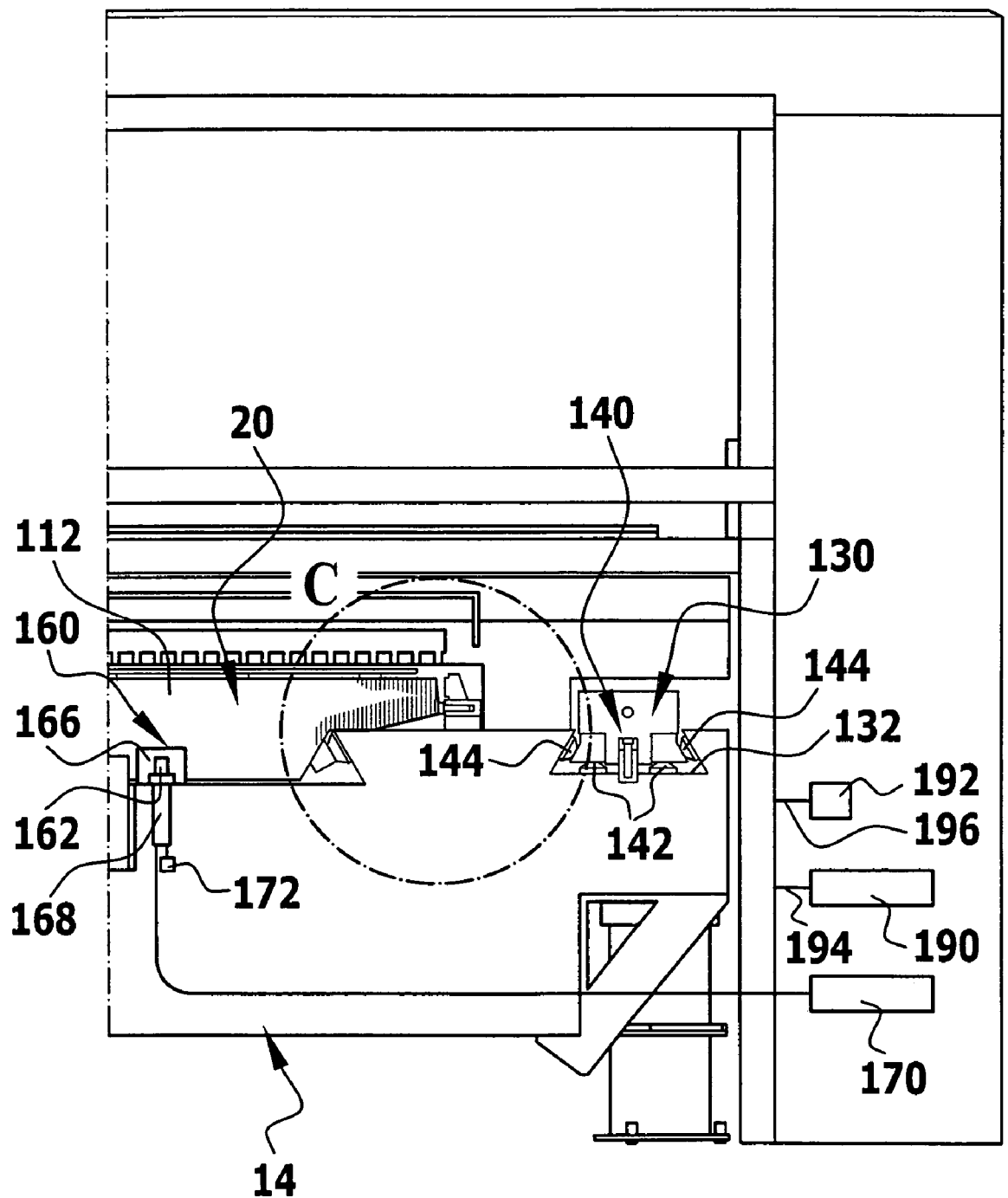
FIG. 8 shows a sectional enlargement of a view in the direction of arrow B in FIG. 1 of the first embodiment.
Figure 9:
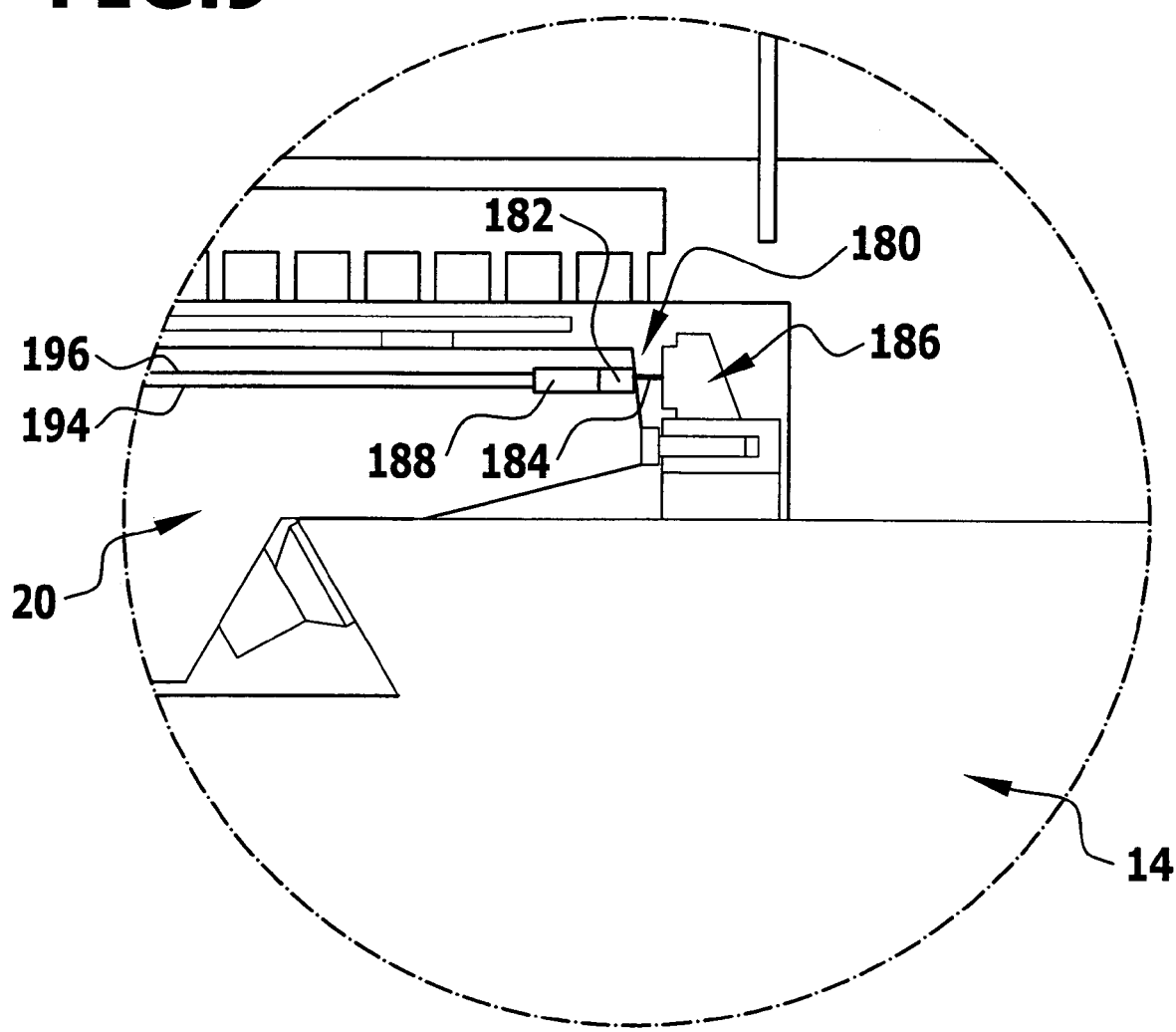
FIG. 9 shows an additional enlargement of the area C in FIG. 8 of the first embodiment.

In order to detect the position of the substrate slide 20 relative to the base member 14, a longitudinal measurement system 160 is provided, on the one hand, as illustrated in FIGS. 8 and 9, and this has a transmitting and receiving head 162 for a laser beam 164 which is held stationarily on the base member 14 and directs the laser beam 164 onto a mirror 166 on the substrate slide 20, in particular, on its closure wall 112 and again receives the laser beam reflected by the mirror 166 and thereby determines the distance between the transmitting and receiving head 162 and the mirror 166 and, therefore, the position of the substrate slide 20 in the first direction X via an interferometer 168 coupled to the transmitting and receiving head 162.

For this purpose, a wavelength stabilizing laser 170, which generates the laser radiation for the longitudinal measurement system 160, as well as a detector 172, which detects the intensity exiting from the interferometer 168, are associated, in addition, with the longitudinal measurement system 160.

Since the guidance of the substrate slide 20 relative to the base member 14 in the first direction X has deviations from an absolutely straight-line guidance, a transverse measurement system 180 is also provided, as illustrated in FIG. 9, and this detects the movements of the substrate slide 20 in the second direction Y which extends at right angles to the first direction X.

The transverse measurement system 180 likewise comprises a transmitting and receiving head 182 which, in this case, is arranged on the substrate slide 20 and transmits a laser beam 184 which impinges on a mirror 186 arranged stationarily on the base member 14.

In the case of the transverse measurement system 180, the mirror 186 has an extension which corresponds at least to the path covered by the transmitting and receiving head 182 during movement of the substrate slide 20 and so the mirror 186 extends at least over the length of the path, along which the laser beam 184 travels during movement of the substrate slide 20 in the first direction X.

In addition, an interferometer 188, with which the distance between the transmitting and receiving head 182 and the mirror 186 can be detected interferometrically, is associated with the transmitting and receiving head 182.

In order, however, not to have to move the laser 190 required for the transverse measurement system 180 as well, the laser 190 and also a detector 192 are arranged stationarily and connected via light guides 194 and 196, respectively, via the supply chain 120 to the interferometer 188 and the transmitting and receiving head 182, wherein the laser radiation is transmitted via the light guides 194, 196 in a polarization maintaining manner.

Figure 10:
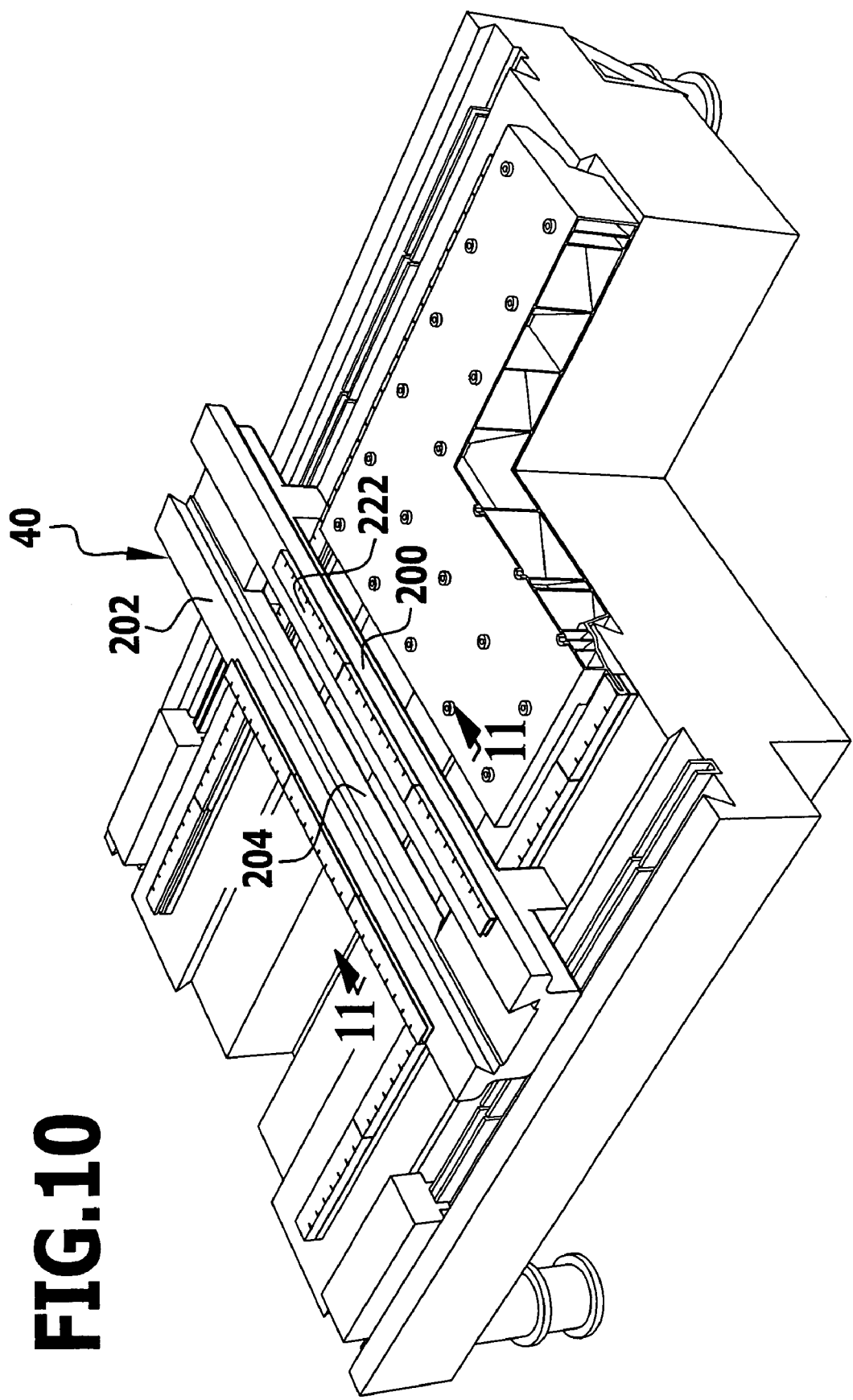
FIG. 10 shows a partially cutaway, perspective view of the base with a bridge similar to FIG. 1 but without an optics slide and optical imaging device and frame of the first embodiment.

As illustrated in FIG. 10, the bridge 40 comprises two bridge supports 200, 202 which are parallel but extend at a distance from one another and between which a free space 204 is provided, through which an exposure of the substrate member 26 moved oscillatingly on the substrate slide 20 can take place.

Figure 11:
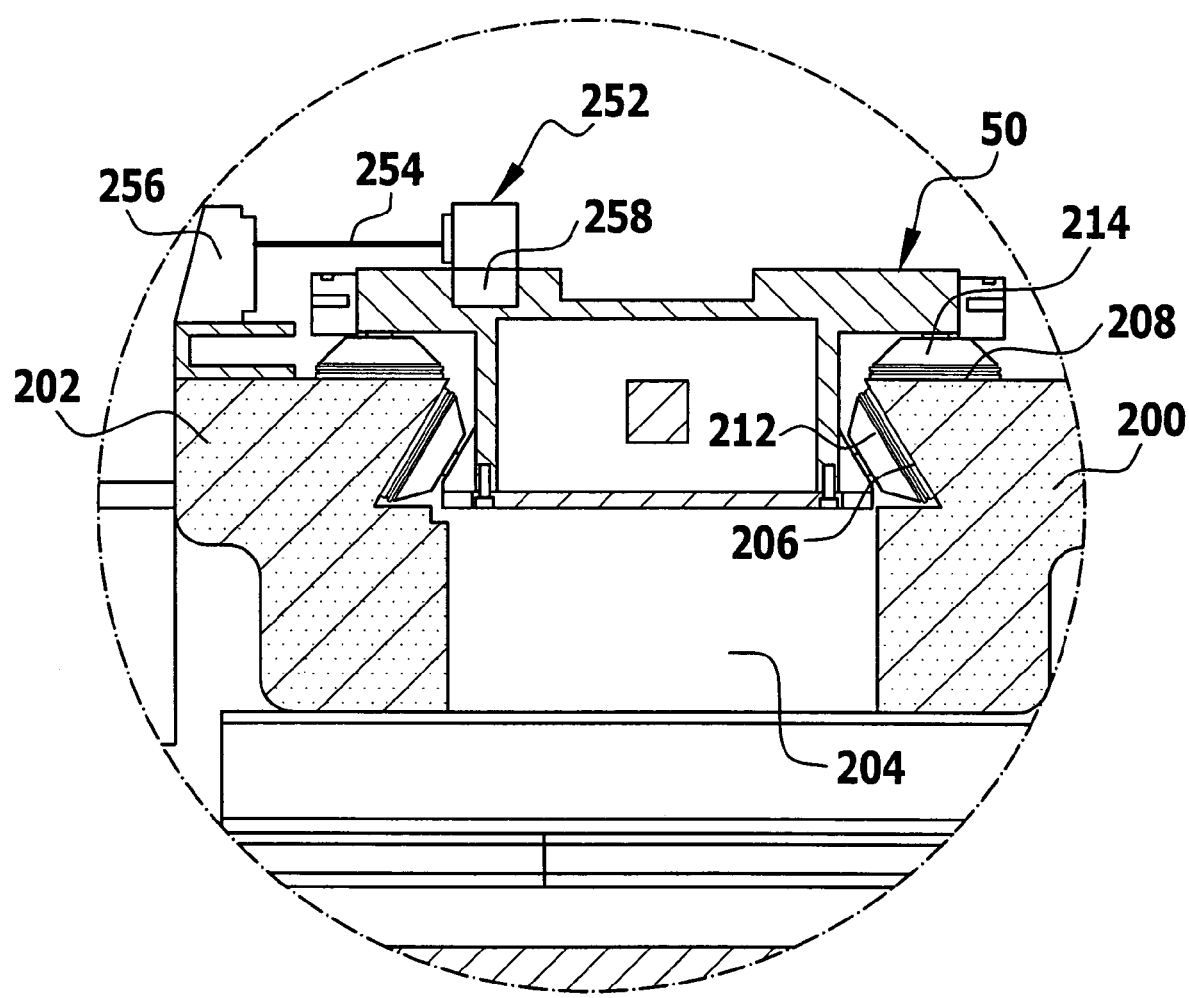
FIG. 11 shows a section along line 11-11 in FIG. 10 of the first embodiment.

Each of the two bridge supports 200, 202 has, as illustrated in FIG. 11, a lateral guide surface 206 and a supporting surface 208, on which sliding members 212 and 214 can be slidingly moved by means of a cushion of air generated by them.

Furthermore, the lateral guide surfaces 206 form an angle of more than 270° with the supporting surfaces 208 and so the optics slide 50 is guided on the two bridge supports 200, 202, as a result, in a dovetailed manner and, therefore, the sliding members 212 not only contribute to the lateral guidance but also represent a securing means against any lifting of the sliding members 214 away from the supporting surfaces 208.

Figure 12:
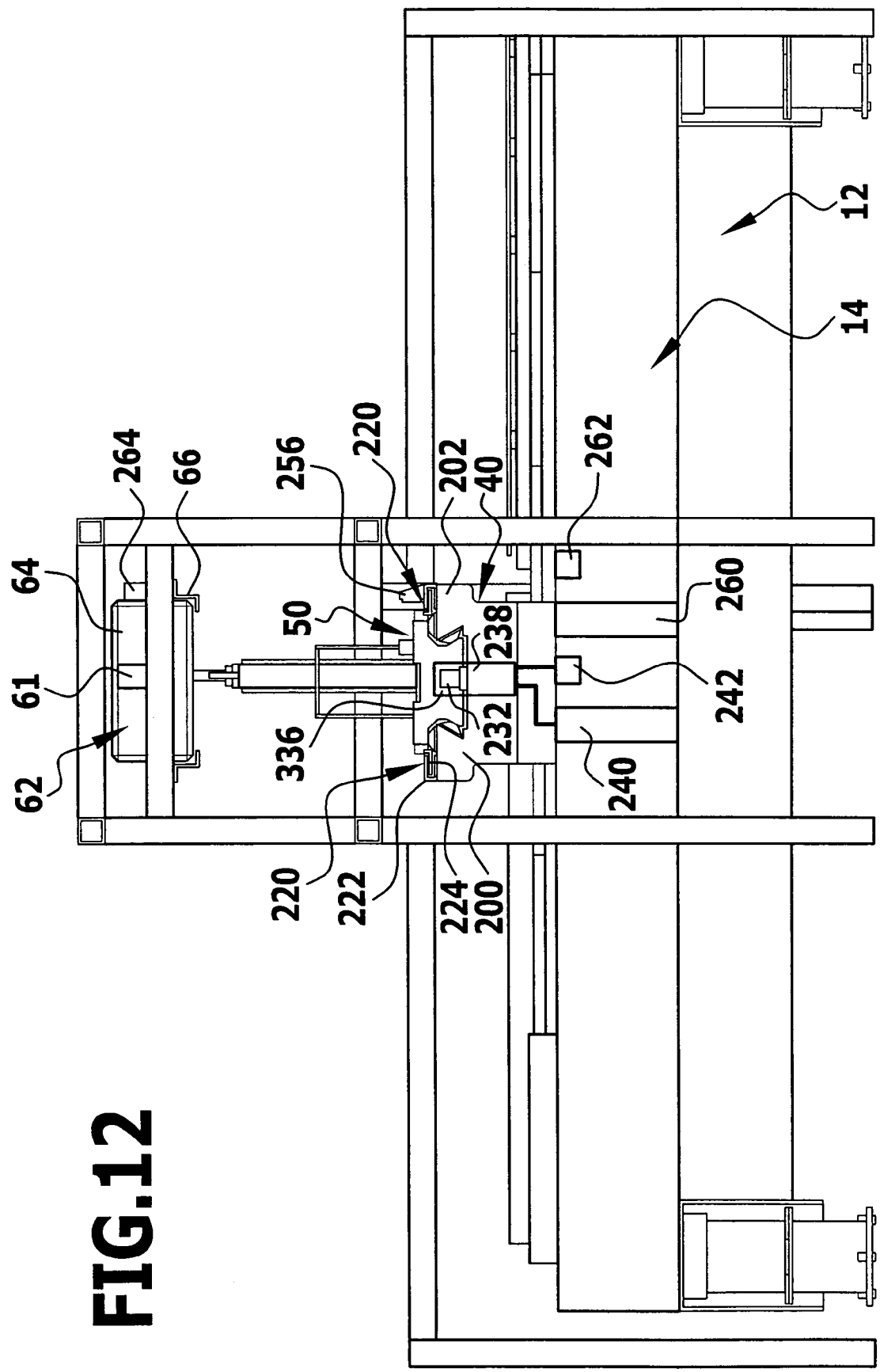
FIG. 12 shows a view in the direction of arrow D in FIG. 1 of the first embodiment.

The drive of the optics slide 50 is brought about, as illustrated in FIG. 10 and FIG. 12, by means of electric linear drives 220 which are arranged on both sides thereof and the stator 222 of which is arranged on a respective one of the bridge supports 200, 202 while a rotor 224 engages in the stator 222 and is respectively connected to the optics slide 50.

In order to detect the position of the optics slide 50, a longitudinal measurement system 230 is provided which has a transmitting and receiving head 232 which transmits a laser beam 234, wherein the laser beam is reflected back again to the transmitting and receiving head 232 at a mirror 236 of the optics slide 50.

Furthermore, an interferometer 238, with which the distance between the transmitting and receiving head 232 and the mirror 236 can be determined, is associated with the transmitting and receiving head 232.

The laser beam 234 for the longitudinal measurement system 230 is generated by a laser 240 and the light exiting from the interferometer 238 is detected by a detector 242.

As a result, it is possible for the control 60 to always detect the position of the optics slide 50 exactly during its movement in the second direction Y.

In the same way, the deviation of the optics slide 50 transversely to a straight-line movement in the second direction Y is detected, as illustrated in FIG. 3, by a transverse measurement system 250 which has a transmitting and receiving head 252 which is arranged on the optics slide 50 and transmits in a known manner a laser beam 254 which is reflected by a mirror 256 extending along the path of movement of the transmitting and receiving head 25, wherein the mirror 256 is arranged stationarily on the bridge support 202.

An interferometer 258, which is seated on the optics slide 50 and, therefore, is moved along with it, is also associated with the transmitting and receiving head 252.

However, in the case of the optics slide 50, as well, the laser 260 for generating the laser beam required for interferometric measurement and, in the same way, the detector 262 are arranged stationarily on the machine frame 12.

It is, therefore, possible with the transverse measurement device 250 to detect the movement of the optics slide 50 transversely, in particular, at right angles to the second direction Y exactly and, therefore, to also recognize guidance inaccuracies during the guidance of the transverse slide 50 on the bridge 40 and, where applicable, to correct these via the control 60—as will be described in detail in the following.

As illustrated, in addition, in FIG. 12, the light source slide 64 can also be driven by a linear drive 264, namely approximately synchronously with the optics slide 50 but with an accuracy which is considerably less and so the linear drive 264 makes only a rough positioning of the light source slide 64 relative to the optics slide 50 and synchronously to it possible.

As illustrated in FIGS. 14 to 17, an optics unit 270 movable relative to the optics slide 50 is arranged on the optics slide 50 and this optics unit can be moved by an actuating drive 272 in a third direction Z which extends at right angles to a coating surface 274 and, therefore, also at right angles to the upper side 28 of the substrate member 26 in order to preset a distance between a microscopic optics device 276 of the optical imaging device 52.

The optical imaging device 52 comprises, for its part, a lens system which is combined with the microscopic optics device 276 and is in a position to image individual fiber end surfaces 278 of a bundle of fibers 280 onto the substrate surface 274 in a focused manner.

In order to position the fiber ends 278 of the bundle of fibers 280 exactly, the bundle of fibers 280 is accommodated in a positioning device which is designated as a whole as 282 and is able to position the entire bundle of fibers 280 and, therefore, also the fiber ends 278 relative to the optical imaging device 52 in the direction of three axes, namely an $X_o$ axis, a $Y_o$ axis and a $Z_o$ axis.

The $Z_o$ axis extends, for example, parallel to the third direction Z and the $X_o$ axis and the $Y_o$ axis preferably extend parallel to the first direction X and to the second direction Y, respectively.

Figure 17:
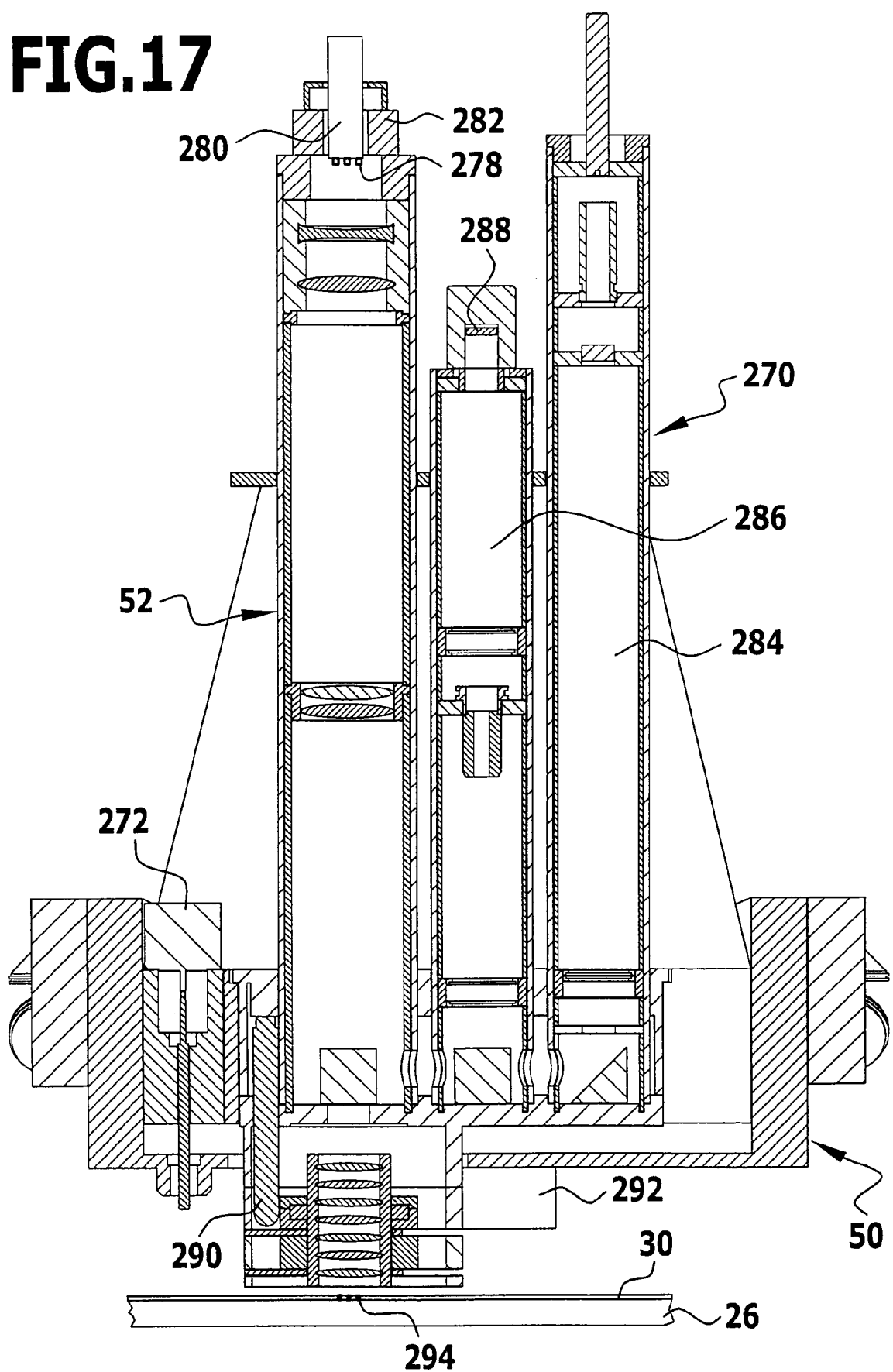
FIG. 17 shows a side view of the section along line 15-15 in FIG. 14 of the first embodiment.

As a result of the positioning device 282, it is possible to displace the fiber ends 278 of the bundle of fibers relative to the optical imaging device 52 in the direction of the $X_o$ axis and the $Y_o$ axis and, therefore, to also displace image spots or exposure spots 294 of the fiber ends 278 generated by the optical imaging device 52 by way of focusing on the substrate surface 274 to a corresponding extent in the first direction X and the second direction Y, respectively (FIG. 17).

The positioning device 282 can therefore be used such that with it a one-time setting of the position of the bundle of light guides 280 formed as a bundle of fibers takes place. It is, however, also conceivable to adjust the position of the bundles of fibers 280 in $Y_o$ direction by means of the control 60 when, for example, a deviation from a straight-line movement of the optics slide 50 is detected with the transverse measurement device 250.

A displacement of the fiber ends 278 of the bundle of fibers 280 with the positioning device 282 in the direction $Z_o$ facilitates, in addition, a deviation from an optimum focus and, therefore, a defocusing, as a result of which enlarged exposure spots 294 result on the coating surface 274 in comparison with an optimum focusing.

In addition, the positioning device 282 also allows a rotation of the bundle of fibers 280 about the $Z_o$ direction, the $X_o$ direction and the $Y_o$ direction as axis of rotation so that a tilting of the bundle of fibers 280 with the fiber ends 278 on all sides likewise opens up the possibility of an additional adjustment and positioning.

An optical illuminating device 284 and an optical monitoring device 286 are associated, in addition, with the optical imaging device 52 and these devices are all coupled to the optical imaging device 52 in such a manner that an illumination of the coating surface 274 and monitoring of the coating surface 274 take place through the microscopic optics device 276 and, therefore, the exposure of the coating surface 274 with the exposure spots 294 via a camera chip 288 of the optical monitoring device 286 is possible through the microscopic optics device 276.

In order to maintain an optimum focusing, the microscopic optics device 276 is adjustable in the third direction Z via adjusting elements 290 and, therefore, the optimum focusing of the fiber ends 278 onto the exposure spots 294 in the coating surface 274 can be maintained by an automatic focusing system 292 activating the adjusting elements 290.

Figure 18:
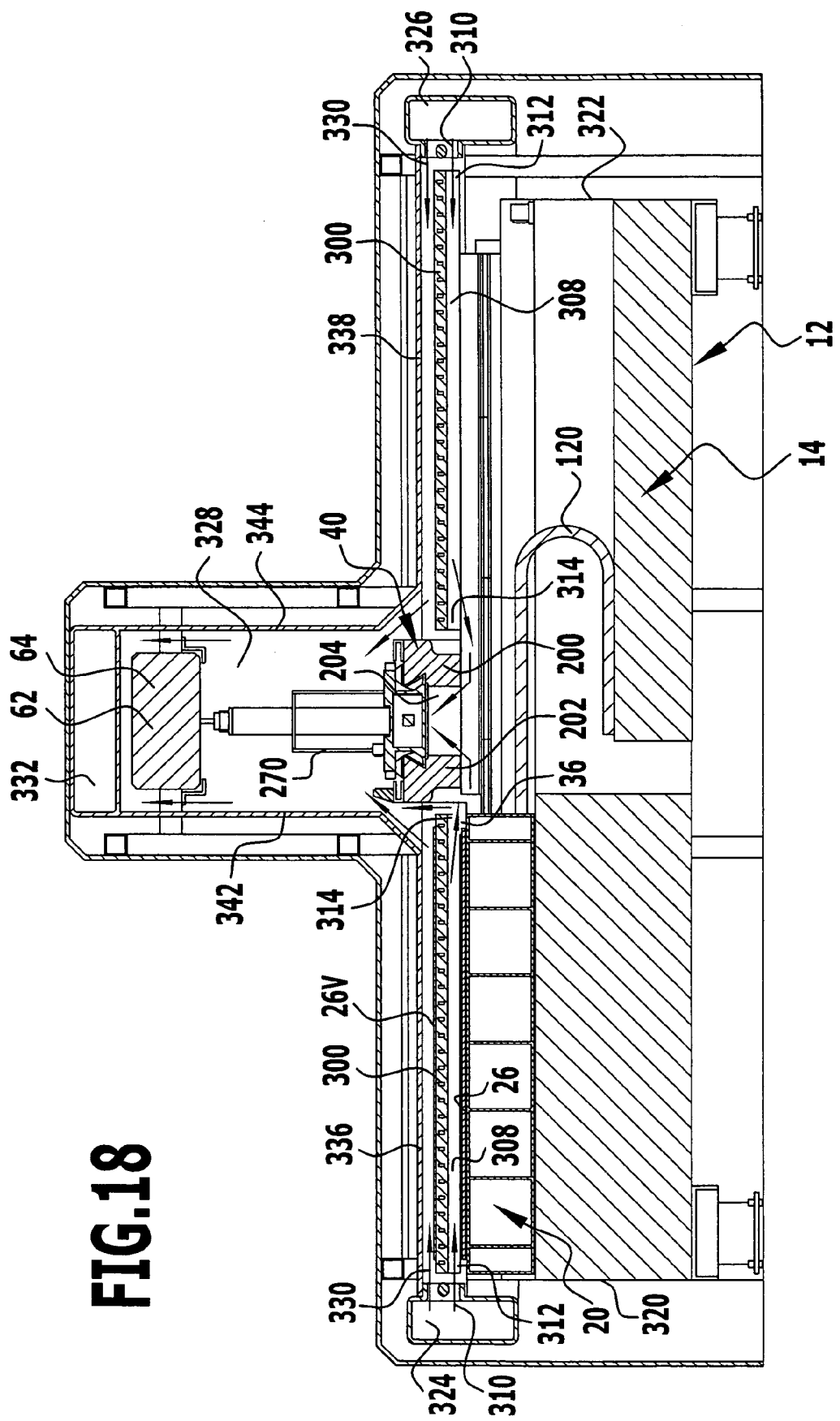
FIG. 18 shows a plan view of the section in the direction of arrow E in FIG. 13 with a dome-shaped cover of the first embodiment.
Figure 19:
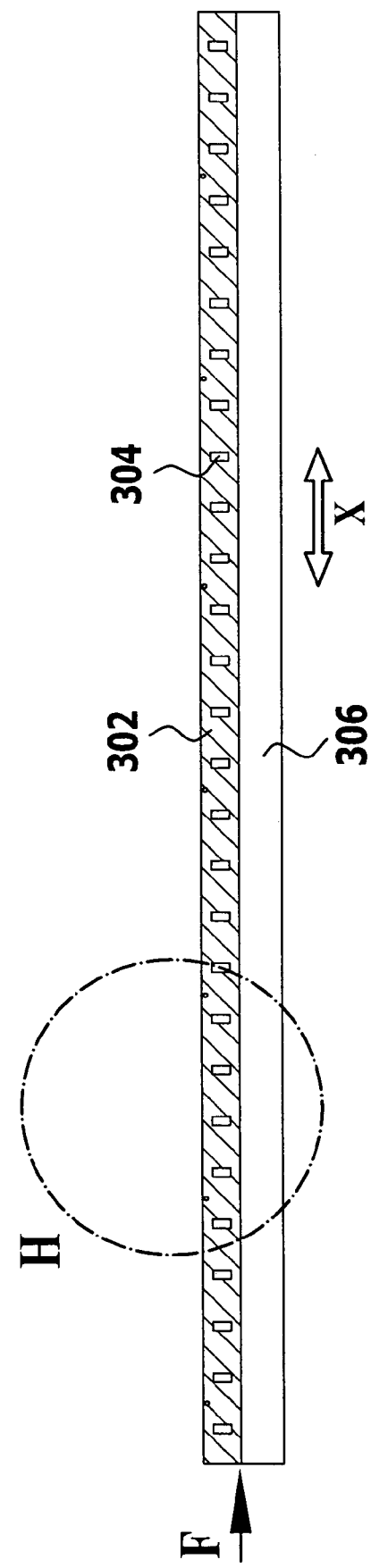
FIG. 19 shows a section similar to FIG. 18 through a heat exchanger element of the first embodiment.
Figure 20:
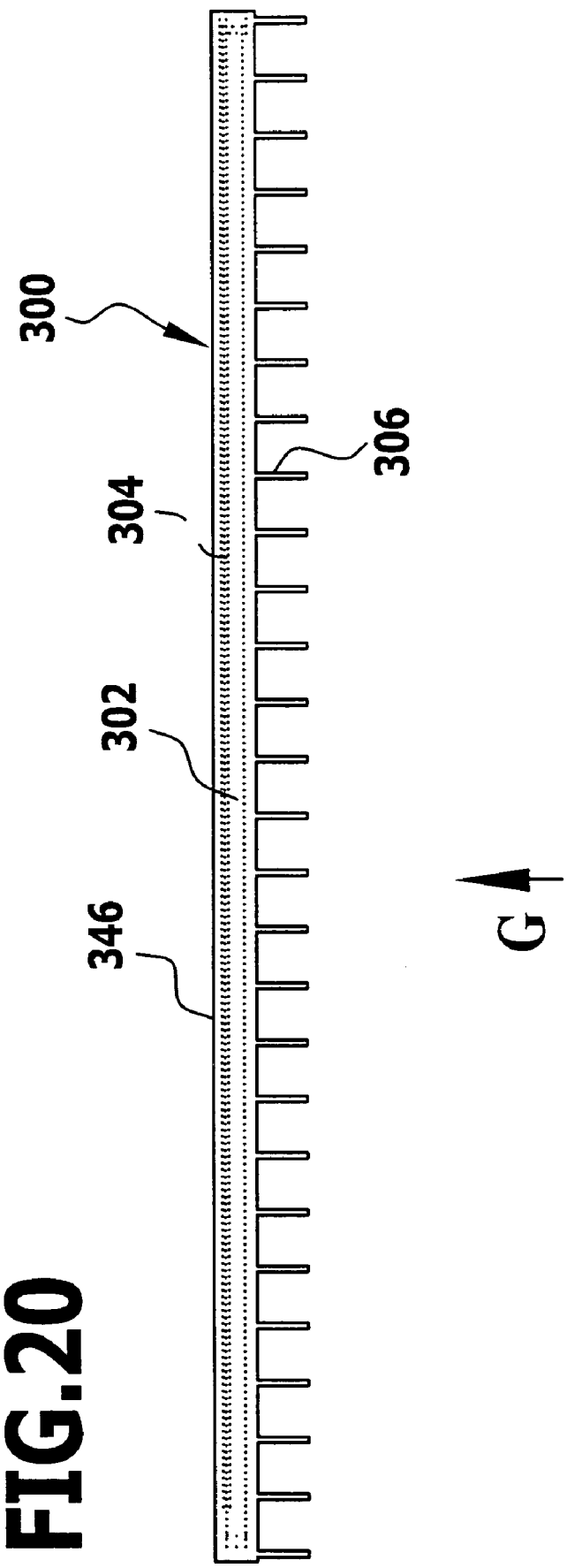
FIG. 20 shows a view of the heat exchanger element in the direction of arrow F in FIG. 19 of the first embodiment.
Figure 21:
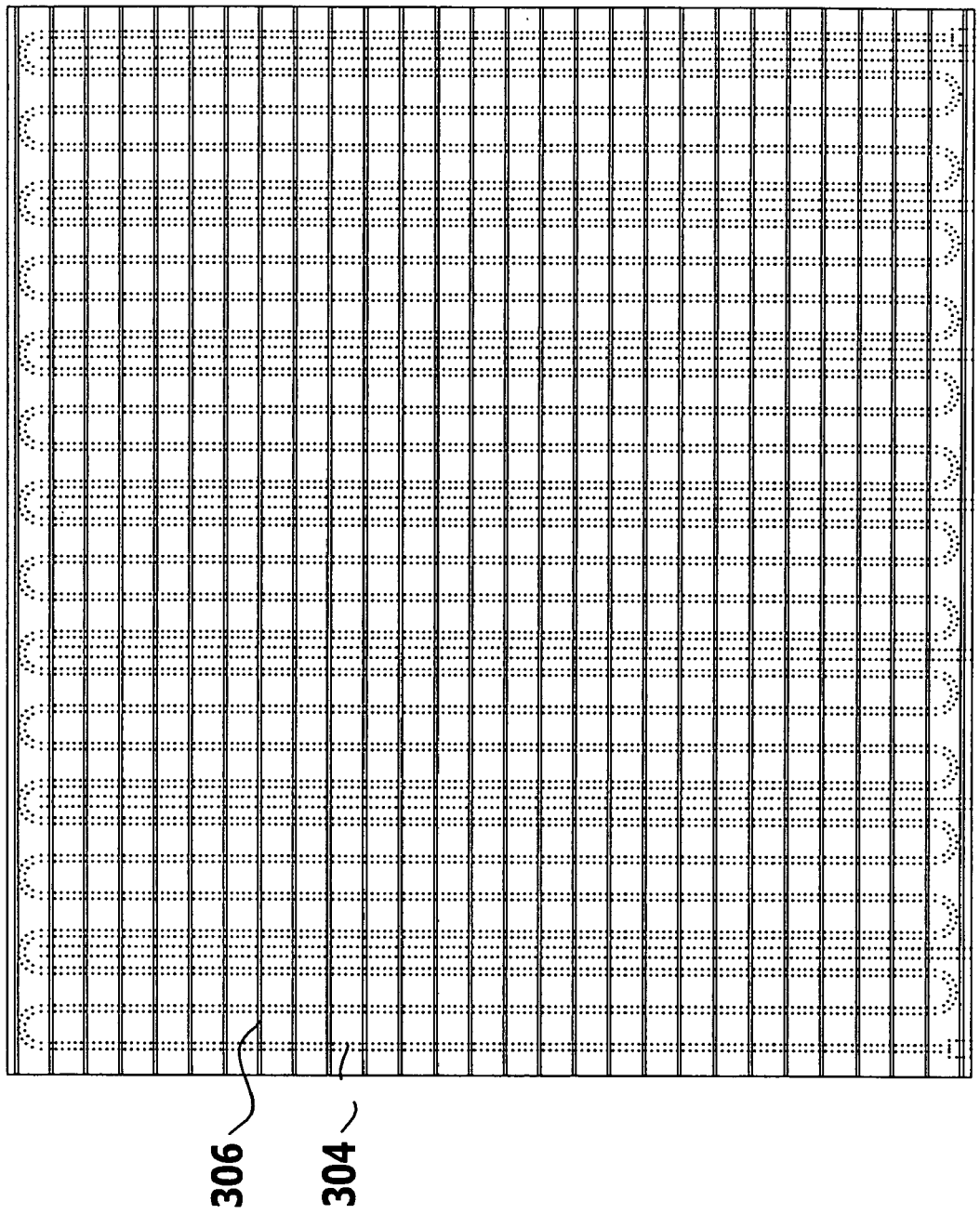
FIG. 21 shows a plan view of the heat exchanger element in the direction of arrow G in FIG. 20 of the first embodiment.
Figure 22:
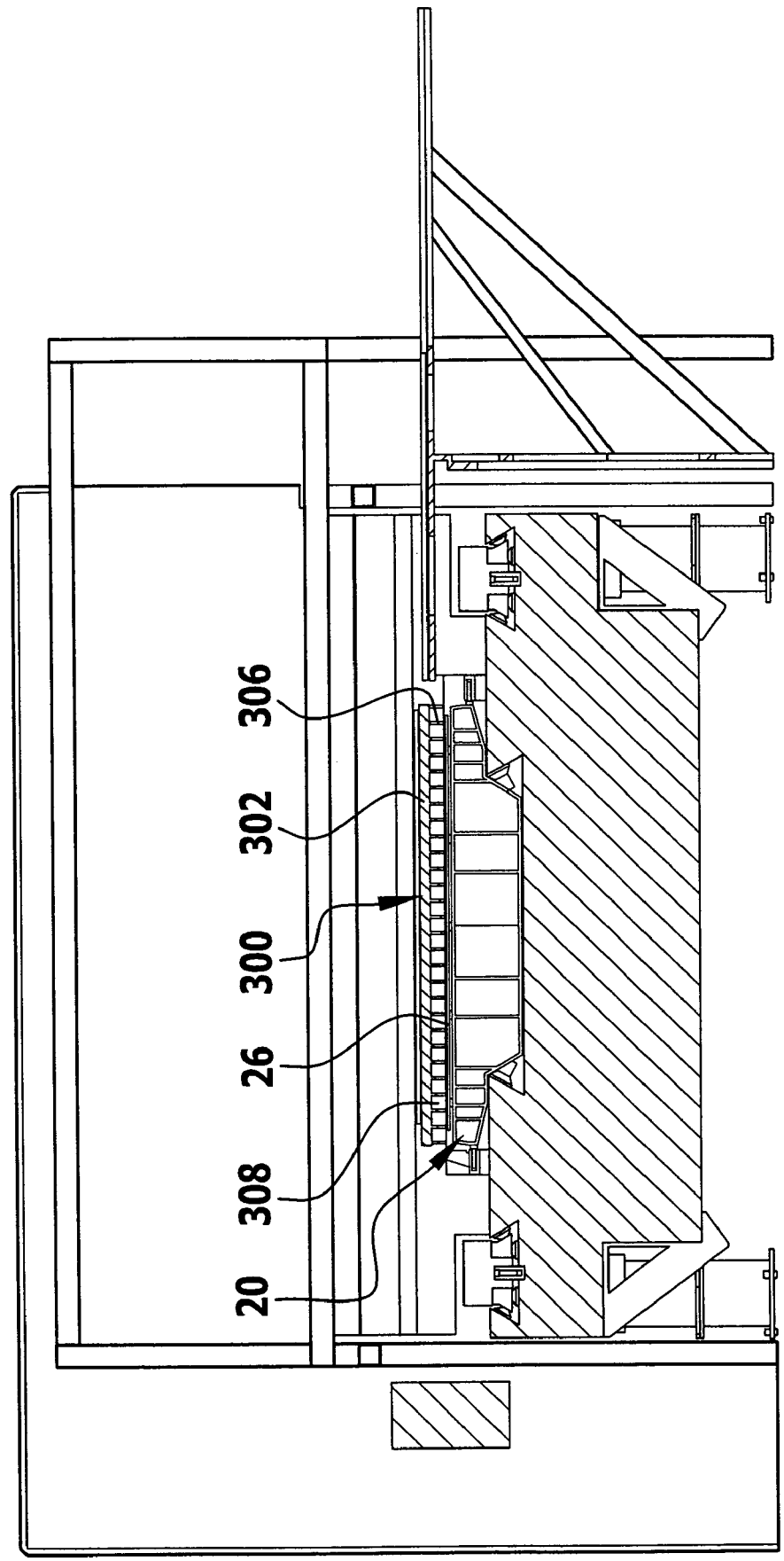
FIG. 22 shows a section similar to FIG. 2 in an embodiment with a lifting table of the first embodiment.
Figure 23:
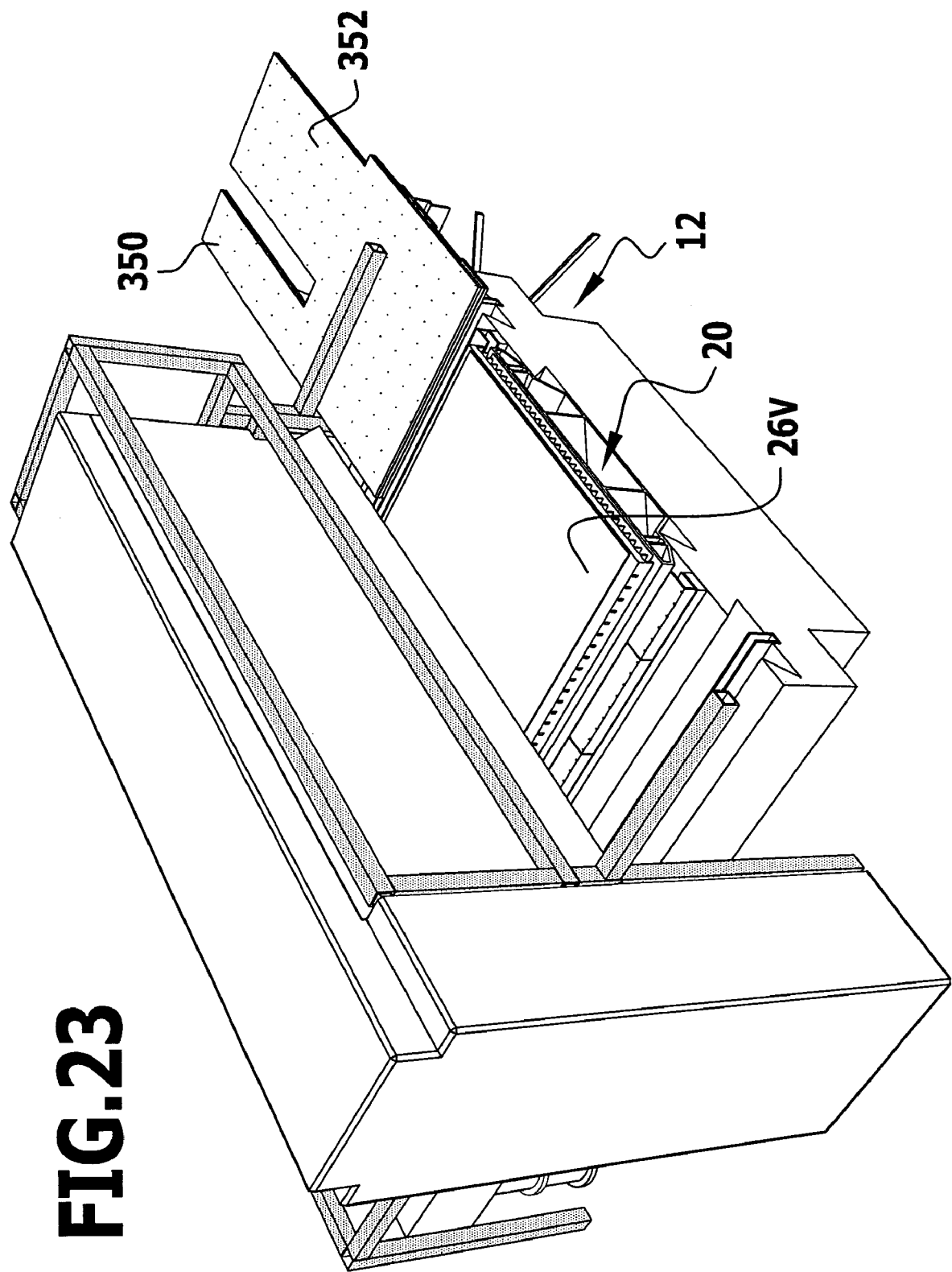
FIG. 23 shows a perspective illustration of the section according to FIG. 22 of the first embodiment.

In order to cool the substrate member 26 movable in the movement area 36 with the optics slide 20, a heat exchanger element 300 is arranged on a side of the substrate member 26 located opposite the substrate slide 20 and this element, as illustrated in FIGS. 18 to 20, comprises a plate-like heat exchanger member 302 which is penetrated by coolant channels 304 which extend through the heat exchanger member 302, for example, in the form of a meander, as indicated in FIG. 20, and have a cooling medium, for example, cooling water, flowing through them.

The heat exchanger member 302 is, in addition, provided with heat exchanger ribs 306 which run parallel to one another and extend parallel to the first direction X and away from the heat exchanger member 302 in the direction of the substrate slide 20 but only to such an extent that the substrate member 26 resting on the substrate slide 20 can be moved under the heat exchanger ribs 306 without contact. This means that the heat exchanger ribs 306 do not penetrate the movement area 36 of the substrate slide 20 and of the substrate member 36.

The heat exchanger ribs 306 do, however, define flow channels 308 which extend parallel to the first direction X above the substrate slide 20 and the substrate member 26 and through which, as illustrated in FIG. 18, a flow 310 of a gaseous cooling medium passes which, on the one hand, flows over the coating surface 274 and, on the other hand, is guided by the flow channels 308, on the one hand, in the first direction X and can be kept by the flow channels 308 at a temperature which can be defined via the heat exchanger element.

As a result, the flow 310 of gaseous cooling medium has the possibility of transferring heat to the heat exchanger ribs 306 and the heat exchanger body 302 on the heat exchanger element 300 along its entire path over the substrate member 26 and, therefore, of maintaining its temperature proceeding from an entry area 312 of the flow channels 308 as far as an exit area 314 thereof due to the exchange of heat.

In this respect, two stationary heat exchanger elements 300 are preferably held on the machine frame 12 and these elements extend, on the one hand, from ends 320 and 322 of the base member 14 which are located opposite one another as far as the bridge 40, are arranged with their entry areas 312 in the area of the ends 320 and 322 and face the bridge 40 with their exit areas 314, for example, are essentially adjoined thereto.

The flow 310 of the gaseous cooling medium is supplied by supply channels 324 and 326 to the entry areas 312 of the heat exchanger elements 300.

Furthermore, the supply channels 324 and 326 are designed such that they supply, in addition to the flow 310 which passes through the flow channels 308, a flow 330 of gaseous cooling medium which flows over the respective heat exchanger element 300 on a side located opposite the flow channels 308.

The flows 310 and 330 of the gaseous cooling medium are deflected in the area of the bridge 40 in such a manner that the flow 310, for example, passes through the free space 204 between the bridge supports 200, 202 and the flow 330 flows around the outside of the bridge supports 200, 202 so that the two flows 310 and 330 enter an optics movement area 328, flow first of all around and cool the optics unit 270 in this area and then, subsequently, the light source unit 62, as well, which leads to the greatest amount of heating up of the gaseous cooling medium.

Figure 13:
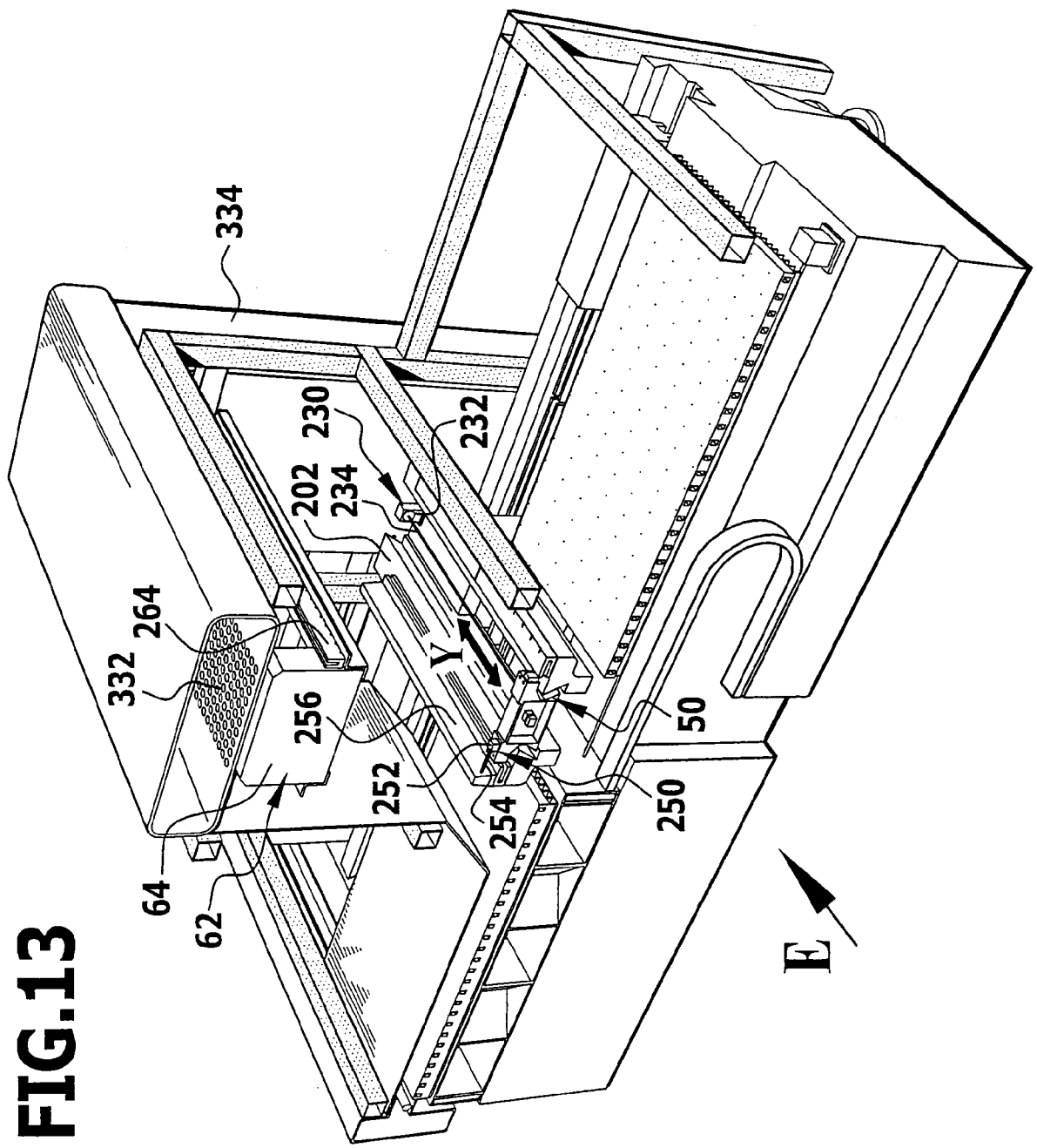
FIG. 13 shows a section along line 13-13 in FIG. 1 of the first embodiment.
Figure 14:
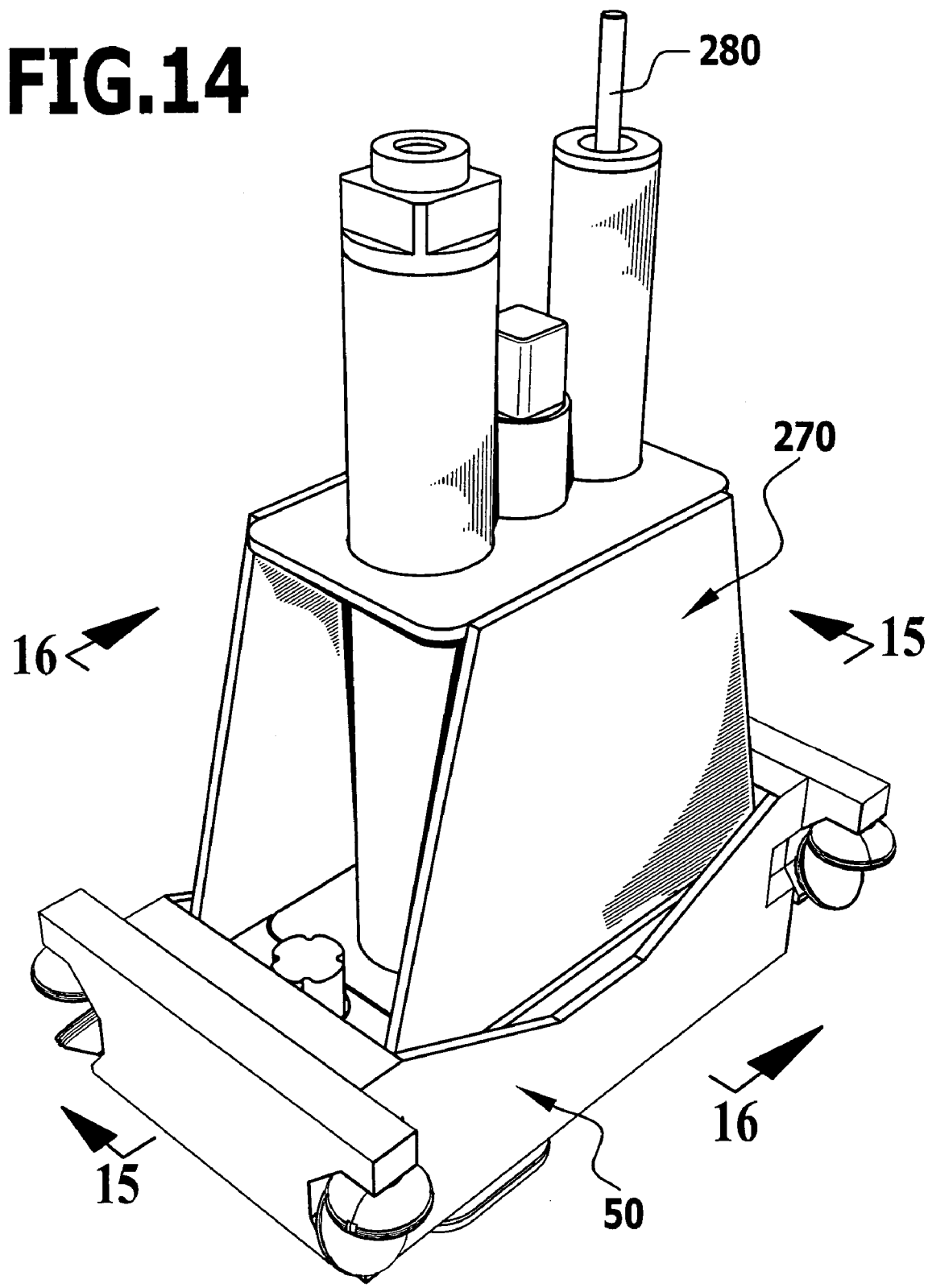
FIG. 14 shows a perspective illustration of an optics slide with an optics unit of the first embodiment.
Figure 15:
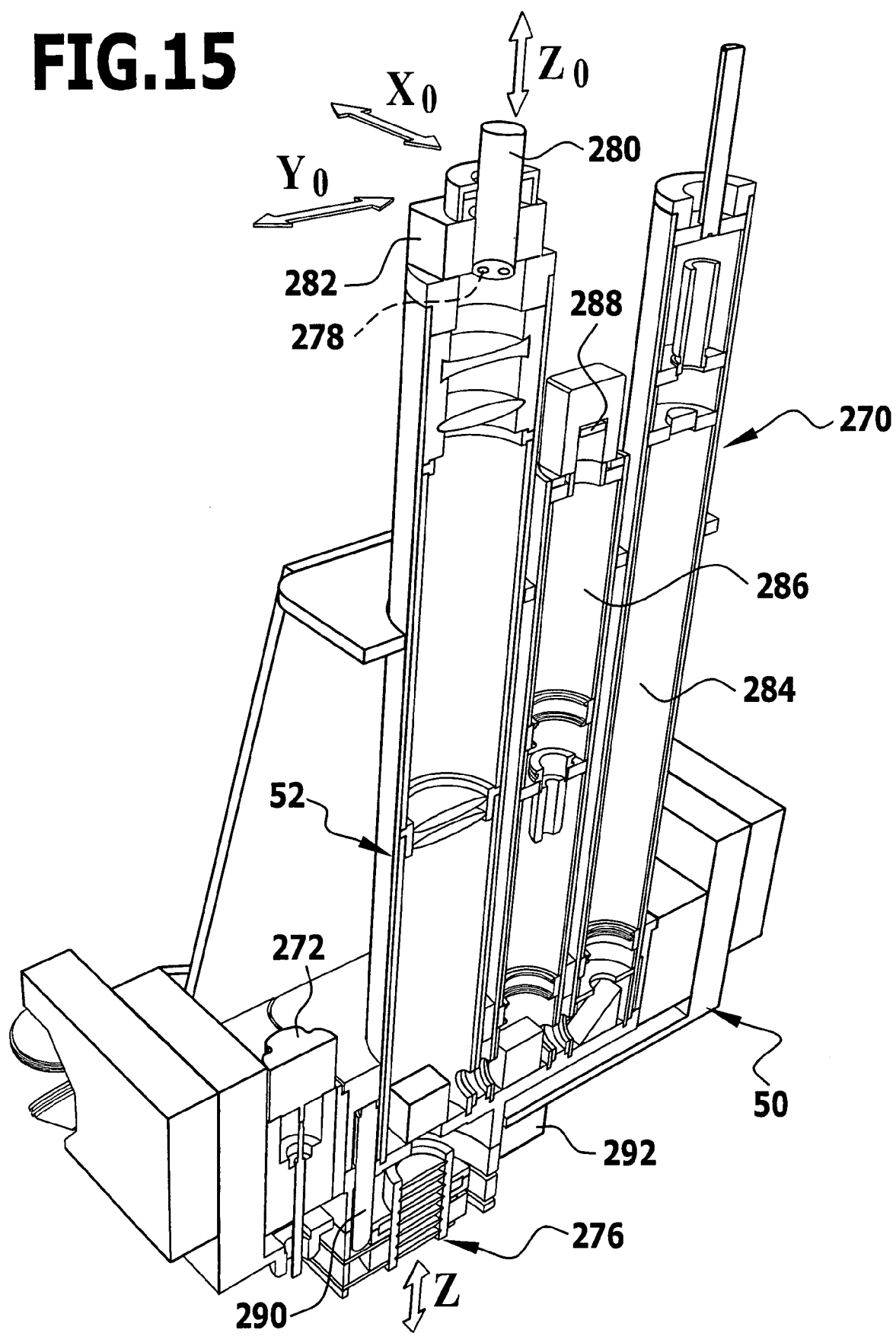
FIG. 15 shows a perspective illustration of a section along line 15-15 in FIG. 14 of the first embodiment.
Figure 16:
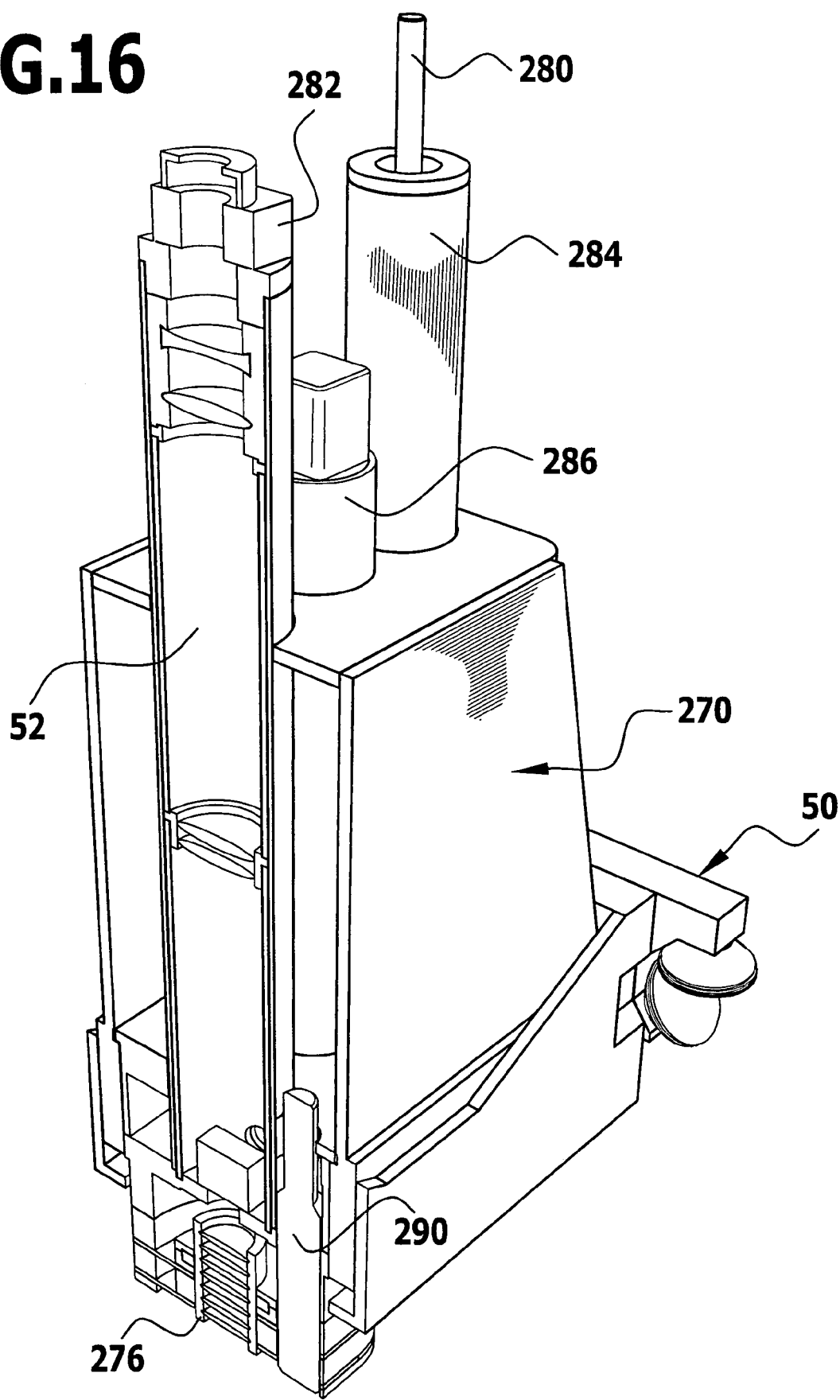
FIG. 16 shows a perspective illustration of a section along line 16-16 in FIG. 14 of the first embodiment.

The cooling medium with the flows 310 and 330 is not cooled further in the area of the optics unit 270 but rather heats up appreciably, also, in particular, when flowing around the light source unit 62 and is guided through a discharge channel 332 to a reprocessing device 334 for the gaseous cooling medium which is illustrated, for example, in FIG. 13, purifies the gaseous cooling medium, on the one hand, and, on the other hand, cools it again to a predetermined temperature, with which the reprocessing device 334 injects the gaseous cooling medium back into the supply channels 324, 326 in order to supply this to the heat exchanger elements 300 again in the manner described.

As illustrated in FIG. 18, the guidance of the flows, in particular, of the flow 330 is improved, in addition, due to the fact that guide walls 336, 338 are provided in the area of the heat exchanger elements 300 and these walls guide, in particular, the flow 330 of the gaseous cooling medium in the direction of the bridge 40.

Furthermore, guide walls 342 and 344 are provided subsequent to the bridge and these walls guide the flows 310 and 330 around the optics unit 270 in the region of the optics movement area 38 and also around the light source unit 62 and, finally, into the discharge channel 332 so that an optimum cooling of the optics unit 270 and the light source unit 62 is also brought about.

The heat exchanger elements 300 may, in the case of the solution according to the invention, be used, however, not only for the purpose of stabilizing the temperature of the flows 310 of the gaseous cooling medium but at the same time for the purpose of bringing substrate members 26v which are not yet to be exposed to the predetermined temperature of the gaseous cooling medium, wherein the substrate members 26v can preferably be placed directly on an upper side 346 of the heat exchanger elements 300 located opposite the heat exchanger ribs 306.

As a result, it is possible to place an additional substrate 26v on the upper side 326 of one of the heat exchanger elements 300 at the same time as the photosensitive coating 30 of the substrate member 26 located on the substrate slide 20 is being exposed and to bring it to the temperature of the cooling medium in the exposure system according to the invention at the same time during the exposure of the photosensitive coating 30 on the substrate member 26.

In order to be able to place a substrate member 26v either on the heat exchanger element 300 or the substrate slide 20, a lifting table is provided which is designated as a whole as 350, is held on the machine frame 20 to the side of the substrate slide 20 and is adjustable with its upper side 352 either such that this is aligned in a plane with the upper side 346 of the heat exchanger element 300 or is adjustable such that the upper side 352 is aligned with the supporting surface 24 of the substrate slide 20.

Figure 24:
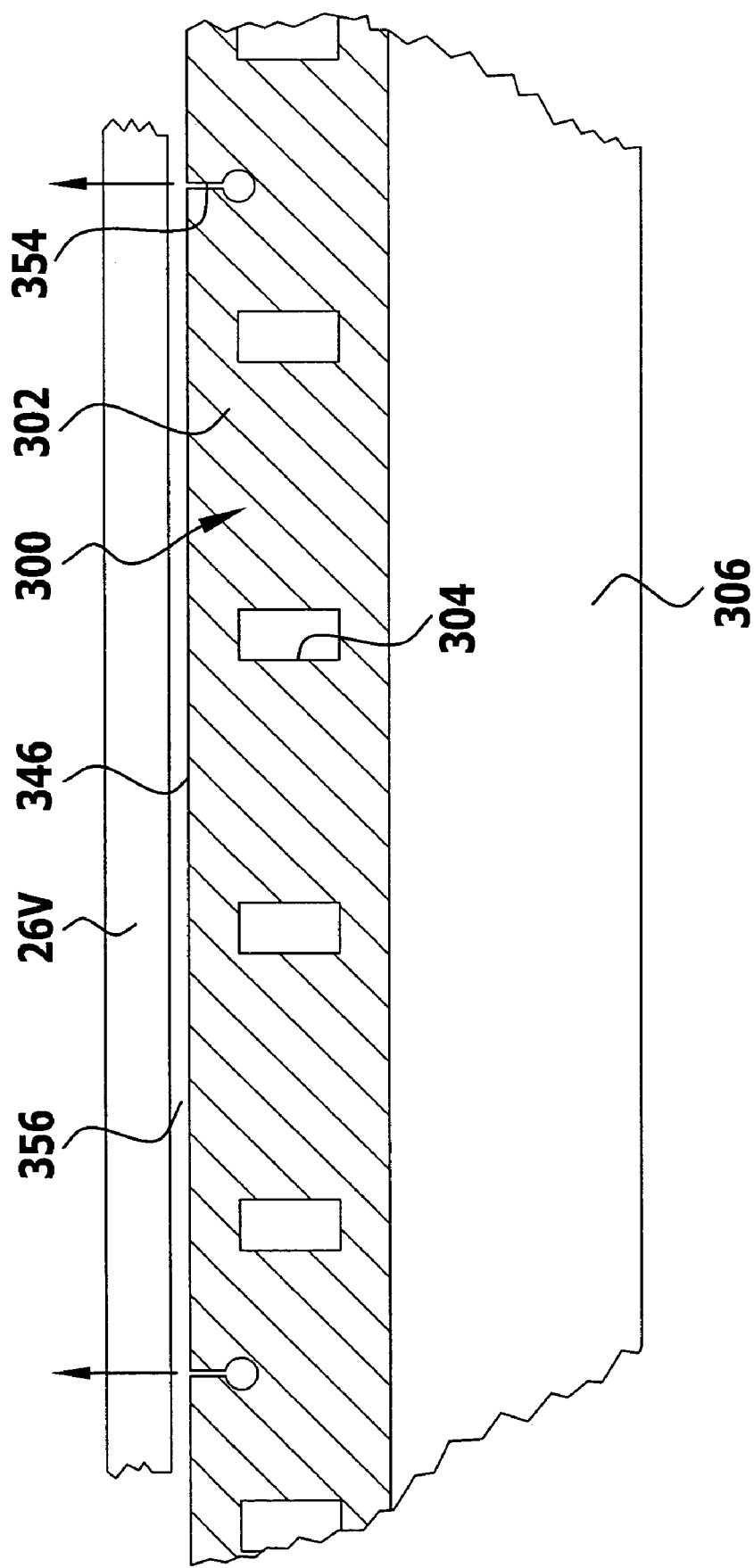
FIG. 24 shows a sectional, enlarged illustration of an area H in FIG. 19 of the first embodiment.

Furthermore, in order to move the substrate member 26 or 26v from the upper side 352 of the lifting table 350 onto the heat exchanger element 300 or the supporting surface 24 of the substrate slide 20, the respective upper sides of the lifting table 350 and the heat exchanger element 300 are, as illustrated in FIG. 24, provided with nozzles 354 which allow the substrate member 26 to be able to swim on a cushion of gas 356 and, therefore, open up the possibility of moving the substrate member slidingly on the cushion of gas 356. In addition, suction/blast nozzles 358 are—as illustrated in FIG. 7—provided on the supporting surface 24 of the substrate table 20 and these nozzles make it possible, on the one hand, to generate a cushion of gas for the displacement of the substrate member 26 and, on the other hand, make it possible to draw the substrate member 26 in by suction in order to fix it in position on the substrate slide 20.

In a second embodiment of a coating system according to the invention, those elements which are identical to those of the first embodiment are provided with the same reference numerals, wherein, in this respect, reference is also made in full to the first embodiment.

Figure 25:
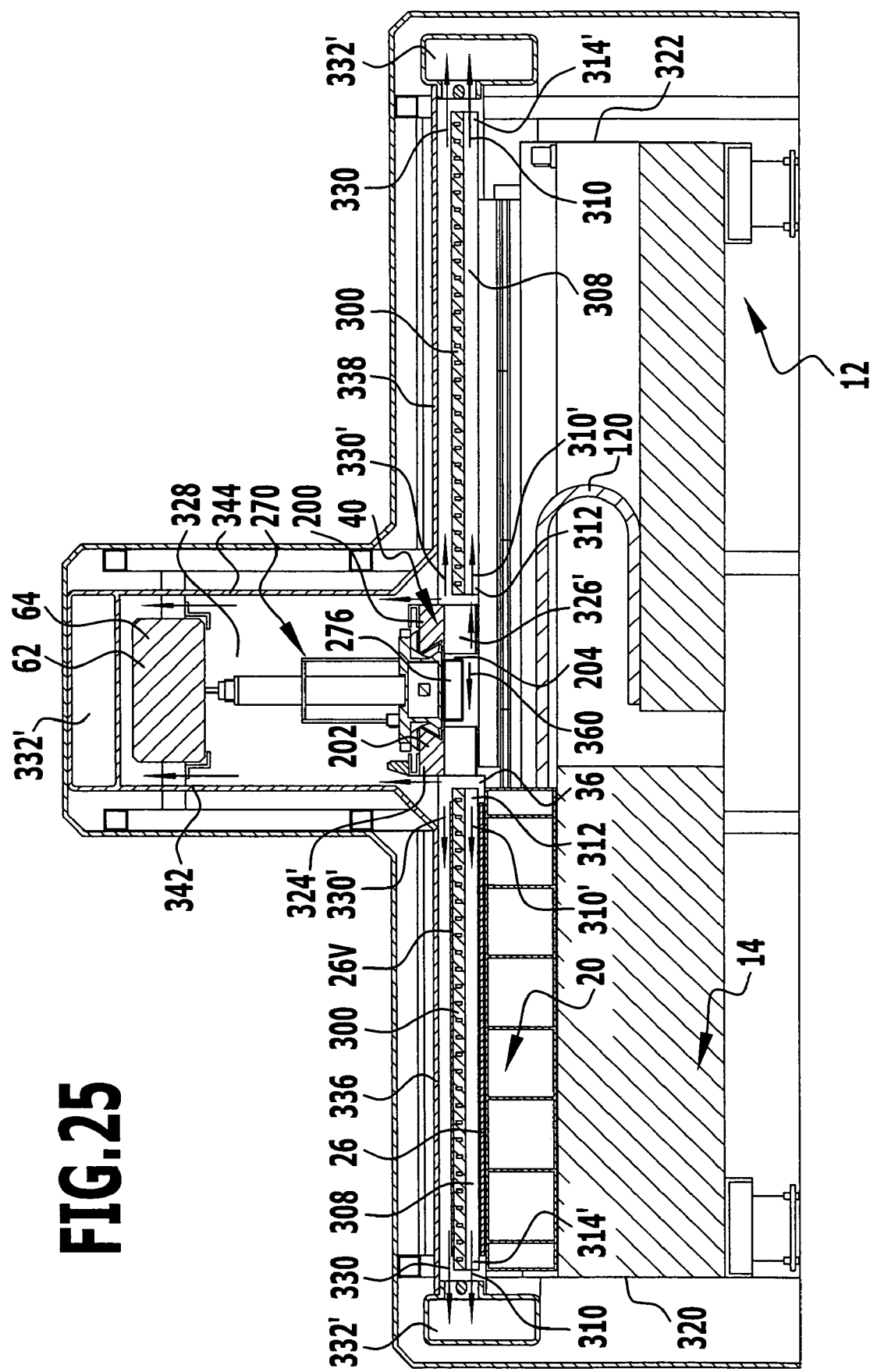
FIG. 25 shows a sectional illustration similar to FIG. 18 in a second embodiment.

The second embodiment, illustrated in FIG. 25, differs from the first embodiment to the extent that the supply channels 324', 326' are arranged in the area of the bridge 40, preferably beneath the bridge supports 200, 202, wherein the gaseous cooling medium exits from them in the form of the flows 310' and 330' and flows in the direction of the discharge channels 332' which are arranged, in this case, in the area of the ends 320 and 322 of the base member 14.

As a result, the entry areas 312' of the flow channels 308 are also located on a side facing the bridge 40 and the supply channels 324', 326' while the exit areas 314' of the flow channels 308 are associated with the ends 320, 322 and the discharge channels 332'.

Proceeding from the supply channels 324', 326' arranged in the area of the bridge 40, the gaseous cooling medium also enters the optics area 328 in the manner described and cools the optics unit 270 and the light source unit 62 to the extent described, wherein the gaseous cooling medium likewise enters the additional discharge channel 332' arranged above the light source unit 62 after flowing around the light source unit 62.

In addition, gaseous cooling medium preferably exits from one of the supply channels 324', 326', for example, from the supply channel 326' in the form of a flow 360 which flows directly to the optical imaging device in the area of the microscopic optics device 276, preferably flows under the microscopic optics device 276 in order to pass between this and the coating 30 to be exposed in order to always keep the microscopic optics device 276 free from dirt particles on its side facing the coating 30.

This flow 360 of gaseous cooling medium is, therefore, not primarily for cooling but rather for keeping the microscopic optics device 276 facing the coating 30 clean.

As for the rest, the second embodiment is designed in the same way as the first embodiment and so reference is made in full to the comments hereto.

Figure 26:
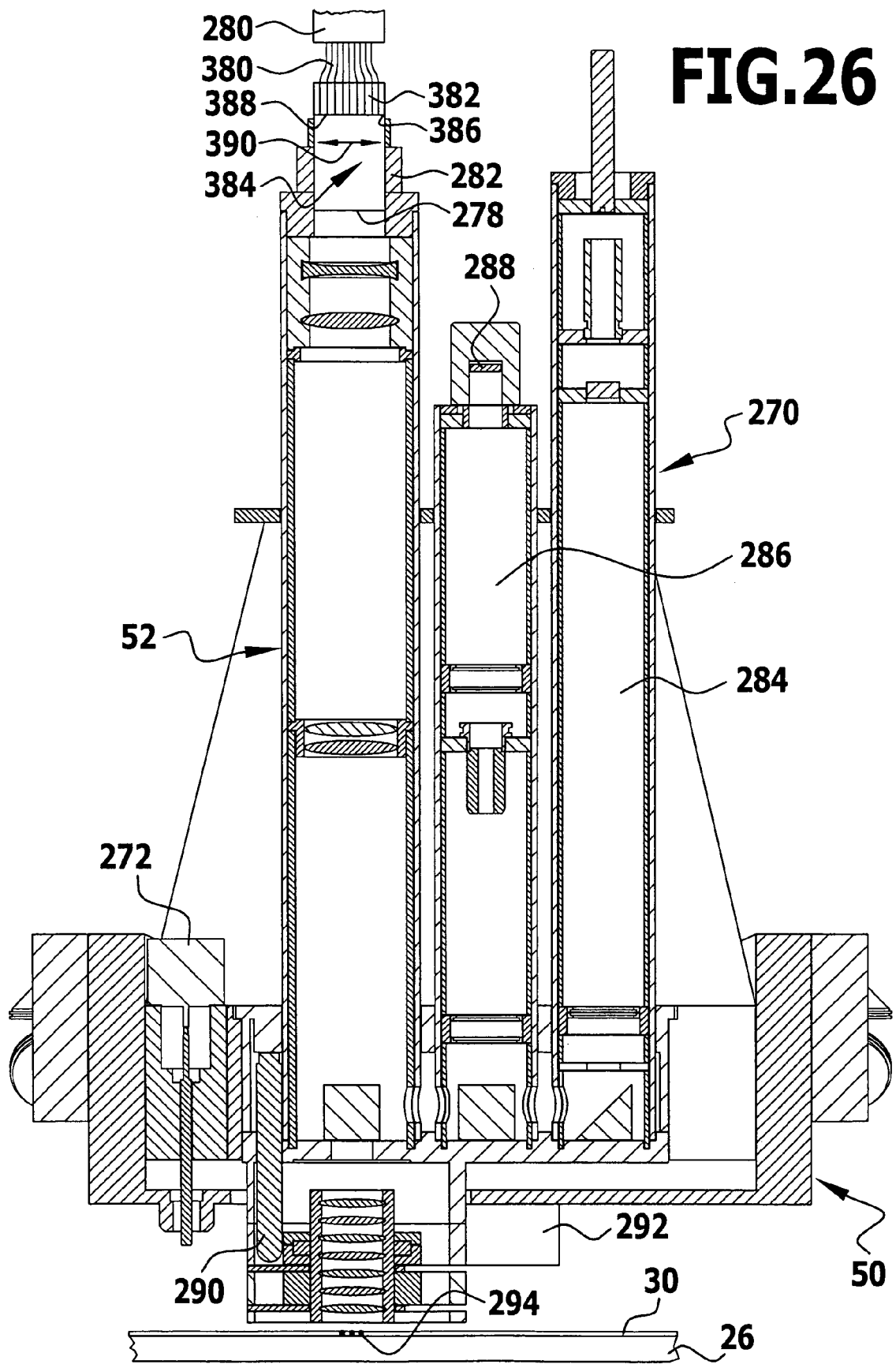
FIG. 26 shows a section similar to FIG. 17 through the optics slide with optics unit of a third embodiment of an exposure system according to the invention.
Figure 27:
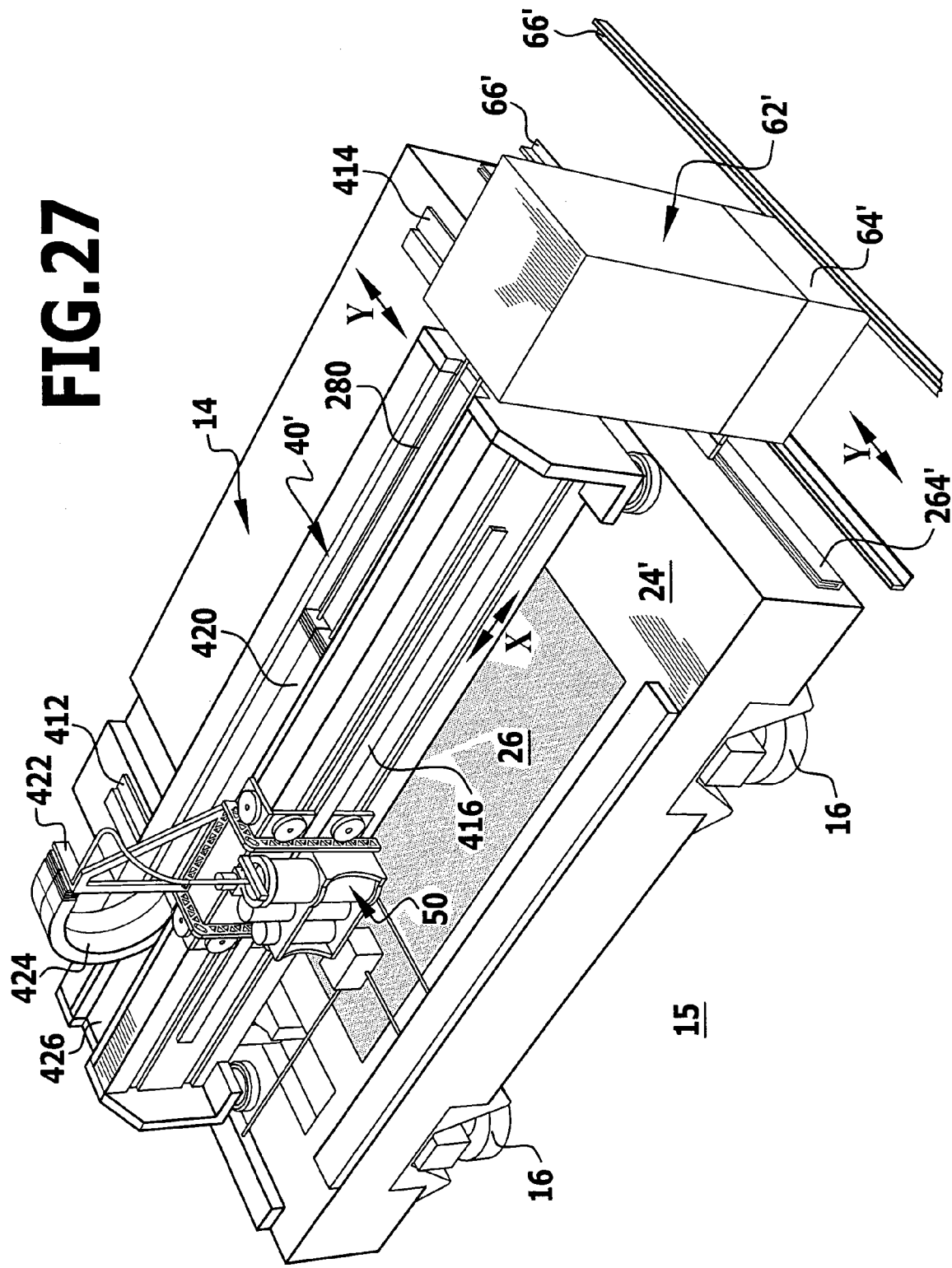
FIG. 27 shows a perspective illustration of a fourth embodiment of an exposure system according to the invention.

In a third embodiment of an exposure system according to the invention, illustrated in FIG. 26, the optics unit 270 is, in principle, of the same design as in the first embodiment but individual light guides 380 are guided out of the bundle of light guides 280 at the end thereof and held in a receiving unit 384 with end areas 382, namely such that the individual end surfaces 386 of the individual light guides 380 are positioned by the receiving unit 384 in a defined manner and are, for example, located in a row 388 which extends in a direction 390 which extends in the third embodiment, for example, parallel to the second direction Y.

As a result of the optical imaging device 52 which, where applicable, also comprises micro-lens systems 53 which are arranged on the receiving unit 384 and associated with the end surfaces 386, each individual one of the end surfaces 386 is imaged into an exposure spot 294 on the photosensitive coating 30 so that a row of exposure spots 294 corresponding to the row 388 of end surfaces 386 can likewise be generated on the photosensitive coating 30.

As for the rest, the third embodiment of the exposure system according to the invention is designed in the same way as the first and the second embodiments and so, in this respect, reference can be made in full to the explanations concerning these embodiments.

In a fourth embodiment of the exposure system according to the invention, illustrated in FIGS. 27 to 31, the base member 14 is likewise provided and this supports, for its part, the supporting surface 24 which is arranged securely on it and on which the substrate member designated as a whole as 26 can be placed.

In contrast to the first embodiment, the bridge designated as a whole as 40' can, in addition, be moved parallel to the second direction Y relative to the base member 14 by means of two linear motors 412 and 414 while the optics slide designated as a whole as 50 can be moved along the bridge 40' parallel to the first direction X and, for this purpose, can be driven by a linear motor 416.

In the fourth embodiment, the light source unit 62' is arranged to the side next to the base member 414 and is seated on a light source slide 64' which is guided, for its part, on slide guides 66' and can be moved along them, wherein the slide guides 66' in the embodiment illustrated extend parallel to the second direction Y but, in this case, are supported on the same floor space 15 as the vibration-damping supports 16.

The optics slide 64' is, in addition, movable in the second direction Y by the linear drive 264', wherein, in this case, the linear drive 264' engages, on the one hand, on the base member 14 and, on the other hand, on the light source slide 64'.

The light source slide 64' of the fourth embodiment can preferably be moved in such a manner that it essentially follows the movements of the bridge 40' in the second direction Y, wherein a rough positioning is, however, sufficient to the extent that the radiation is transferred between the light source unit 62' and the optics unit 270 by the flexible bundle of fibers 280 which, in the fourth embodiment, rests on an upper side of the bridge 40' and is guided via a flexible trailing chain 420 which extends in an arc shape in relation to the optics slide 50.

In this respect, the trailing chain 420 extends in an arc 424 proceeding from a holder 422 provided on the optics slide 50 to a receiving means 426 which is provided on the bridge 40 and into which a more or less larger section of the trailing chain 420 can be laid depending on the position of the optics slide 50.

Figure 28:
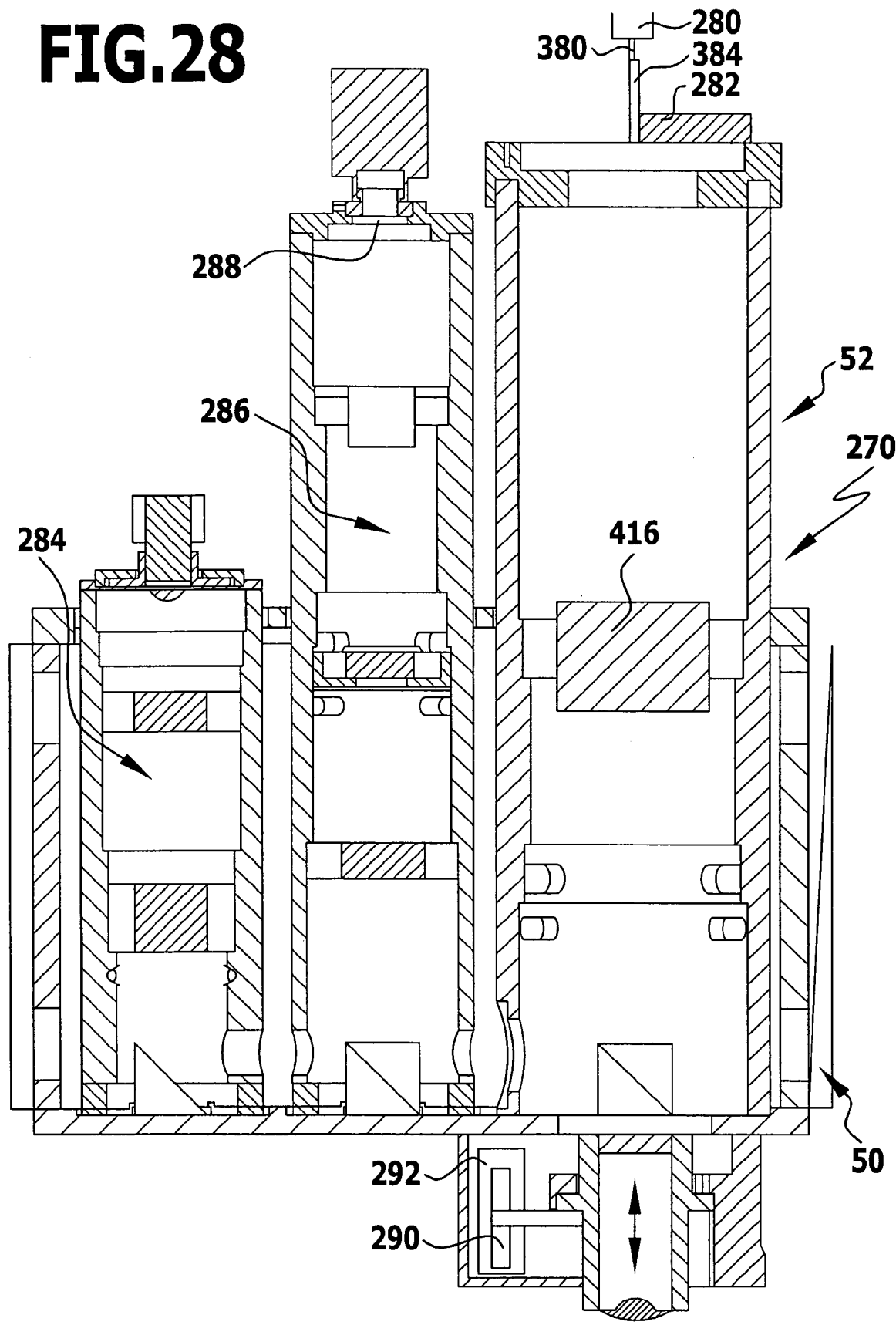
FIG. 28 shows a section similar to FIG. 17 through the optics unit of the fourth embodiment.

As illustrated in FIG. 28, the optics unit 270 is constructed, in principle, in the same way as in the first and third embodiments and so the same reference numbers are used for the same elements and, therefore, reference is also made in full to the explanations concerning the first, second and third embodiments.

Figure 29:
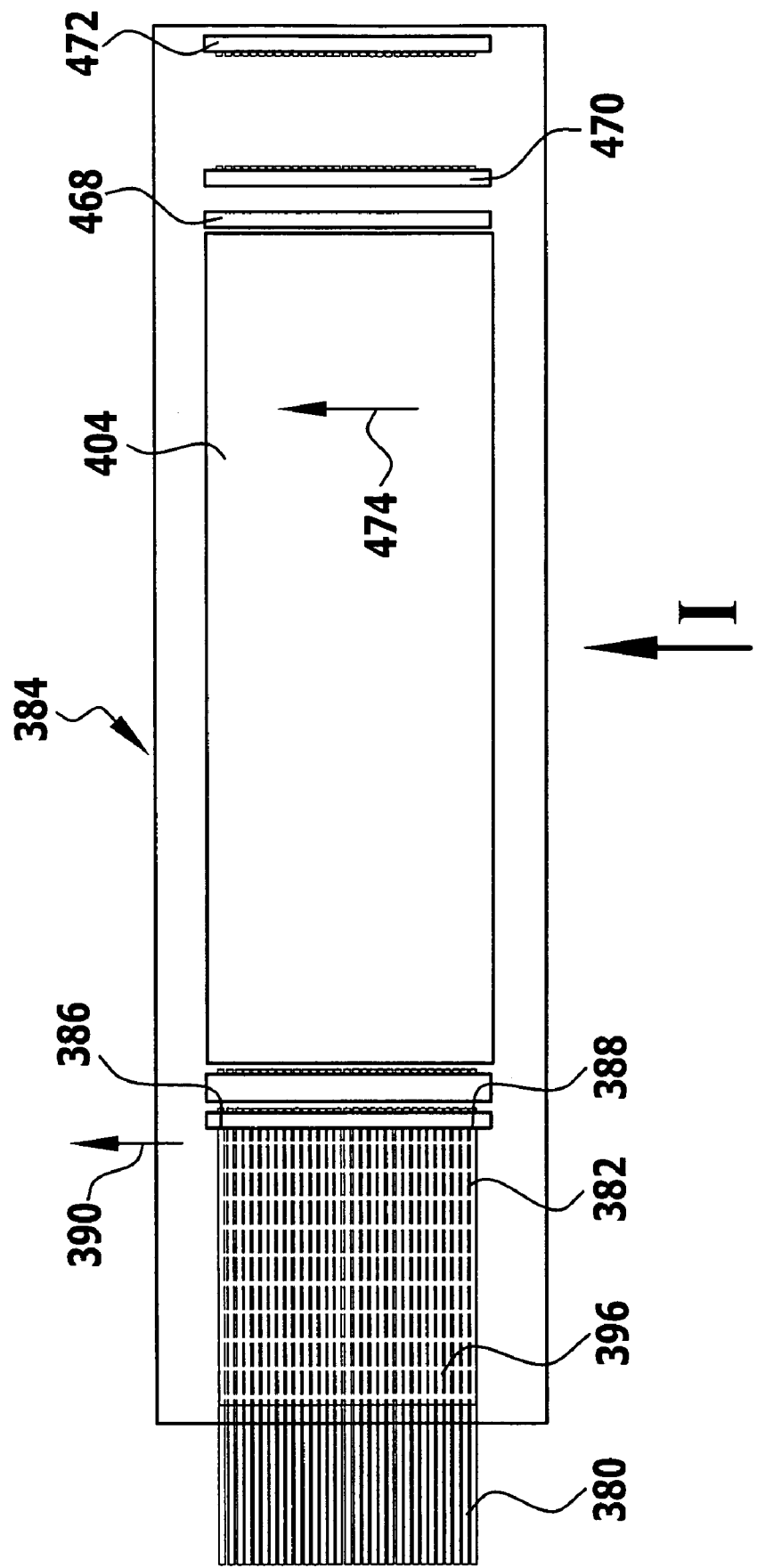
FIG. 29 shows a plan view of a receiving unit of the optics unit of the fourth embodiment.
Figure 30:
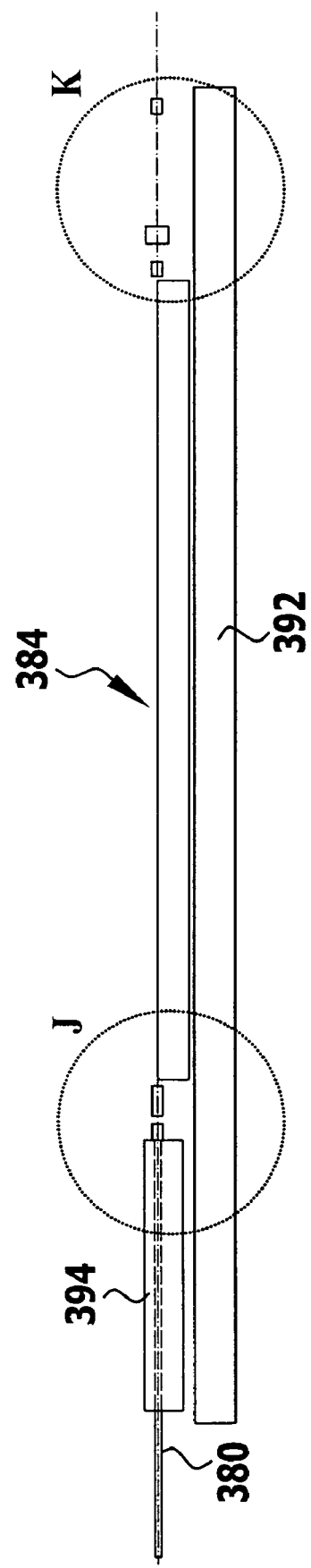
FIG. 30 shows a side view of the receiving unit in the direction of arrow I in FIG. 29

In this respect, the individual light guides 380 guided out of the bundle of fibers 280 are held in the receiving unit 384 with their end areas 382 in the same way as in the third embodiment and so the end surfaces 386 of the individual light guides 380 are also located in the row 388 which extends in the direction 390, wherein the direction 390 preferably extends parallel to the second direction Y (FIGS. 29 to 31).

The receiving unit 384 preferably comprises a base 392, on which a receiving plate 394 is arranged which has a plurality of recesses, for example, grooves 396, in which the end areas 382 of the individual light guides 380 can be placed and, therefore, fixed in position in the receiving plate 394.

A divergent radiation field exits from the individual end surfaces 386 and this field is preferably reshaped each time by a collimation lens 398 to form a collimated radiation field, wherein a collimation lens 398 is associated with each individual end surface 386 and the entirety of the collimation lenses 398 is seated in an array 400 of collimation lenses.

Each radiation field collimated by a collimation lens 398 subsequently experiences a coupling into a waveguide 454, which is designed, for example, as a layer waveguide, by means of a cylindrical optics device 452 and exits from the waveguide again, wherein an additional cylindrical optics device 456 is provided which again forms a collimated radiation field which is then shaped by a telescopic optics device 458, comprising the optical elements 460 and 462, to form an exiting, collimated radiation field 464 which then enters a tubular body system 466, illustrated in FIG. 28.

The individual cylindrical optics devices 452 and 456 are likewise combined to form arrays 467 and 468 of cylindrical optics devices and the optical elements 460 and 462 of the telescopic optics device 458 are combined in the same way to forms arrays 470 and 472.

The waveguide 454 is designed, in particular, as an electro-optical deflection unit, as a result of which a deflection of the radiation exiting from each of the end surfaces 386 can be brought about in a direction 474 which preferably extends parallel to the direction 390 and, in particular, likewise parallel to the second direction Y.

A deflection of the radiation exiting from each of the individual end surfaces 386 also makes it possible, therefore, to displace the exposure spots 294 in the direction 474 and to likewise expose the photosensitive coating 30 by way of deflection of individual exposure spots 294 starting from a row of exposure spots 294 with an inactive deflection unit in the spaces present between the exposure spots.

In a simplified development of the fourth embodiment, the deflectability of the radiation exiting from the end surfaces 386 is dispensed with and so the cylindrical optics devices 452 and 456 as well as the waveguide 454 can be omitted.

The invention claimed is:

1. Exposure system for substrate members bearing a photosensitive coating on a substrate surface, comprising:
   a machine frame,
   a substrate carrier bearing the substrate member, an exposure device, and a control, the substrate member and the exposure device being movable relative to one another in a first direction parallel to a substrate surface and in a second direction parallel to the substrate surface and extending transversely to the first direction such that the photosensitive coating is exposable locally and selectively by exposure spots generatable by the exposure device as a result of the relative movement of the exposure device in relation to the photosensitive coating in the first direction and in the second direction,
   the exposure device having an optics slide movable in the second direction,
   an optical imaging device for the exposure of the substrate member arranged on said optics slide,
   control means for controlling the exposure device and the imaging device,
   the exposure device having a light source unit with a plurality of light sources, radiation of said light sources being guided to the optical imaging device by at least one flexible bundle of light guides,
   an adjustable positioning device responsive to said control for positioning one end of the bundle of light guides relative to the optical imaging device, and
   the positioning device adapted to displace a center point of at least one exposure spot generated by the optical imaging device on the photosensitive coating in at least one direction parallel to a coating surface.

2. Exposure system as defined in claim 1, wherein the light source unit of the exposure device is arranged separately from a bridge guiding the optics slide.

3. Exposure system as defined in claim 2, wherein the light source unit is arranged on one side of the bridge.

4. Exposure system as defined in claim 1, wherein the light source unit is movable with an optics unit in the second direction.

5. Exposure system as defined in claim 4, wherein the light source unit is guided on separate guides.

6. Exposure system as defined in claim 4, wherein the light source unit is movable in the second direction by means of a linear drive.

7. Exposure system as defined in claim 1, wherein the exposure device has a light source slide movable in the second direction, the light source unit being arranged on said slide.

8. Exposure system as defined in claim 7, wherein the light source slide is driven to essentially follow the movements of the optics slide.

9. Exposure system as defined in claim 1, wherein the light source unit is movable on guides arranged outside the machine frame.

10. Exposure system as defined in claim 9, wherein the light source unit is arranged to a side next to an end side of a bridge guiding the optics slide.

11. Exposure system as defined in claim 1, wherein the flexible bundle of light guides is guided in a trailing guide provided on a bridge guiding the optics slide and leading to the optics slide.

12. Exposure system as defined in claim 11, wherein the trailing guide runs in a receiving means provided on the bridge.

13. Exposure system as defined in claim 12, wherein the receiving means is designed as a channel provided in the bridge.

14. Exposure system as defined in claim 1, wherein the positioning device allows the at least one exposure spot generated by the optical imaging device to be displaced on the photosensitive coating in two directions parallel to the coating surface and extending transversely to one another.

15. Exposure system as defined in claim 1, wherein the end of the bundle of light guides is movable relative to the optical imaging device with the positioning device in such a manner that a diameter of at least one exposure spot generatable on the photosensitive coating is variable.

16. Exposure system as defined in claim 1, wherein a receiving unit for the bundle of light guides is movable relative to the optical imaging device with the positioning device in such a manner that a diameter of the at least one exposure spot generatable on the photosensitive coating is variable.

17. Exposure system as defined in claim 1, wherein the optical imaging device is provided with an automatic focusing system.

18. Exposure system as defined in claim 1, wherein the positioning device comprises a piezo drive as an actuating drive.

19. Exposure system as defined in claim 1, wherein:
the optics slide bears an optics unit comprising the optical imaging device, and
the optics unit is movable relative to the optics slide.

20. Exposure system as defined in claim 19, wherein the optics unit is movable relative to the optics slide in a third direction extending transversely to the first and second directions.

21. Exposure system as defined in claim 19, wherein the optics unit comprises an optical monitoring device coupled to the optical imaging device.

22. Exposure system as defined in claim 21, wherein the optical monitoring device is provided with an optical illumination device.

23. Exposure system as defined in claim 1, wherein the optics slide is guided on the machine frame on a guide extending above a movement area of a substrate slide and the substrate member.

24. Exposure system as defined in claim 1, further comprising a longitudinal measurement system for constantly detecting a position of the optics slide in the second direction during movement of the optics slide.

25. Exposure system as defined in claim 1, further comprising a transverse measurement system for constantly detecting a position of the optics slide transverse to the second direction during movement of the optics slide.

26. Exposure system as defined in claim 24, wherein the longitudinal measurement system is an optical measuring device.

27. Exposure system as defined in claim 26, wherein the optical measuring device detects a light path interferometrically.

28. Exposure system as defined in claim 25, wherein the transverse measurement system is an optical measuring device.

29. Exposure system as defined in claim 28, wherein the optical measuring device detects a light path interferometrically.

* * * * *